(12) United States Patent
Kimoto et al.

(10) Patent No.: US 11,996,449 B2
(45) Date of Patent: *May 28, 2024

(54) SEMICONDUCTOR DEVICE WITH CARBON-DENSITY-DECREASING REGION

(71) Applicant: ROHM CO., LTD., Kyoto (JP)

(72) Inventors: Tsunenobu Kimoto, Kyoto (JP); Takuma Kobayashi, Kyoto (JP); Yuki Nakano, Kyoto (JP); Masatoshi Aketa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/955,067

(22) Filed: Sep. 28, 2022

(65) Prior Publication Data

US 2023/0019556 A1    Jan. 19, 2023

Related U.S. Application Data

(63) Continuation of application No. 16/962,160, filed as application No. PCT/JP2019/000540 on Jan. 10, 2019, now Pat. No. 11,502,172.

(30) Foreign Application Priority Data

Jan. 17, 2018   (JP) ................................. 2018-005735

(51) Int. Cl.
    *H01L 29/16*    (2006.01)
    *H01L 21/02*    (2006.01)
    (Continued)

(52) U.S. Cl.
    CPC .... *H01L 29/1608* (2013.01); *H01L 21/02238* (2013.01); *H01L 21/02614* (2013.01);
    (Continued)

(58) Field of Classification Search
    CPC .......... H01L 29/1608; H01L 21/02238; H01L 21/02614; H01L 21/28556; H01L 29/0607;
    (Continued)

(56) References Cited

U.S. PATENT DOCUMENTS 5,144,398 A  *  9/1992  Morishita ........... H01L 29/7375
                                                  257/E27.149
2011/0049530 A1     3/2011  Dhar et al.
    (Continued)

FOREIGN PATENT DOCUMENTS

DE    102008011648 A1    9/2008
DE    112014003518 T5    4/2016
    (Continued)

OTHER PUBLICATIONS

International Search Report and Written Opinion issued for International Patent Application No. PCT/JP2019/000540, dated Apr. 9, 2019, 12 pages including English translation of Search Report.

(Continued)

*Primary Examiner* — Duy T Nguyen
(74) *Attorney, Agent, or Firm* — XSENSUS LLP

(57) ABSTRACT

A semiconductor device includes a SiC semiconductor layer that has a carbon density of $1.0 \times 10^{22}$ cm$^{-3}$ or more, a SiO$_2$ layer that is formed on the SiC semiconductor layer and that has a connection surface contiguous to the SiC semiconductor layer and a non-connection surface positioned on a side opposite to the connection surface, a carbon-density-decreasing region that is formed at a surface layer portion of the connection surface of the SiO$_2$ layer and in which a carbon density gradually decreases toward the non-connection surface of the SiO$_2$ layer, and a low carbon density region that is formed at a surface layer portion of the (Continued)

non-connection surface of the $SiO_2$ layer and that has a carbon density of $1.0 \times 10^{19}$ cm$^{-3}$ or less.

18 Claims, 35 Drawing Sheets

(51) Int. Cl.
*H01L 21/285* (2006.01)
*H01L 29/06* (2006.01)
*H01L 29/423* (2006.01)
*H01L 29/66* (2006.01)

(52) U.S. Cl.
CPC .... *H01L 21/28556* (2013.01); *H01L 29/0607* (2013.01); *H01L 29/4236* (2013.01); *H01L 29/66045* (2013.01)

(58) Field of Classification Search
CPC ........... H01L 29/4236; H01L 29/66045; H01L 29/1095; H01L 29/36; H01L 29/42368; H01L 29/513; H01L 29/66068; H01L 29/66333; H01L 29/66348; H01L 29/7395; H01L 29/7397; H01L 29/7802; H01L 29/7813
USPC .......................................................... 257/77
See application file for complete search history.

(56) References Cited

U.S. PATENT DOCUMENTS

| | | |
|---|---|---|
| 2012/0241767 A1 | 9/2012 | Yano et al. |
| 2013/0306982 A1 | 11/2013 | Kudou |
| 2014/0264382 A1 | 9/2014 | MacMillan et al. |
| 2015/0028352 A1 | 1/2015 | Okumura |
| 2015/0236148 A1* | 8/2015 | Masuda ............... H01L 29/4975 257/77 |
| 2015/0295079 A1* | 10/2015 | Nakano ............. H01L 29/41741 257/330 |
| 2015/0303271 A1 | 10/2015 | Tanaka et al. |
| 2017/0033185 A1 | 2/2017 | Shimizu et al. |
| 2017/0345657 A1 | 11/2017 | Shimizu et al. |
| 2017/0345903 A1* | 11/2017 | Shimizu ................ B60L 15/007 |

FOREIGN PATENT DOCUMENTS

| | | |
|---|---|---|
| DE | 102016112877 A1 | 3/2017 |
| JP | 2001345320 A | 12/2001 |
| JP | 2012238887 A | 12/2012 |
| JP | 2013171875 A | 9/2013 |
| JP | 2013232533 A | 11/2013 |
| JP | 2014-110402 A | 6/2014 |
| JP | 2015138960 A | 7/2015 |
| JP | 2017034003 A | 2/2017 |
| JP | 2017216306 A | 12/2017 |
| WO | 2011074237 A1 | 6/2011 |
| WO | 2012127821 A1 | 9/2012 |
| WO | 2015008385 A1 | 1/2015 |

OTHER PUBLICATIONS

International Preliminary Report on Patentability issued for International Patent Application No. PCT/JP2019/000540, dated Jul. 30, 2020, 21 pages including English translation.
Notice of Reasons for Refusal issued for Japanese Patent Application No. 2019-566441, dated Sep. 15, 2022, 16 pages including English machine translation.
Notification of Reasons for Refusal mailed Jan. 18, 2024, in the corresponding Japanese divisional patent application No. 2022-178306, 11 pages. (With English Translation).
German Office Action issued Jan. 31, 2024 in corresponding German Patent Application No. 112019000292.9, 16 pages.

* cited by examiner

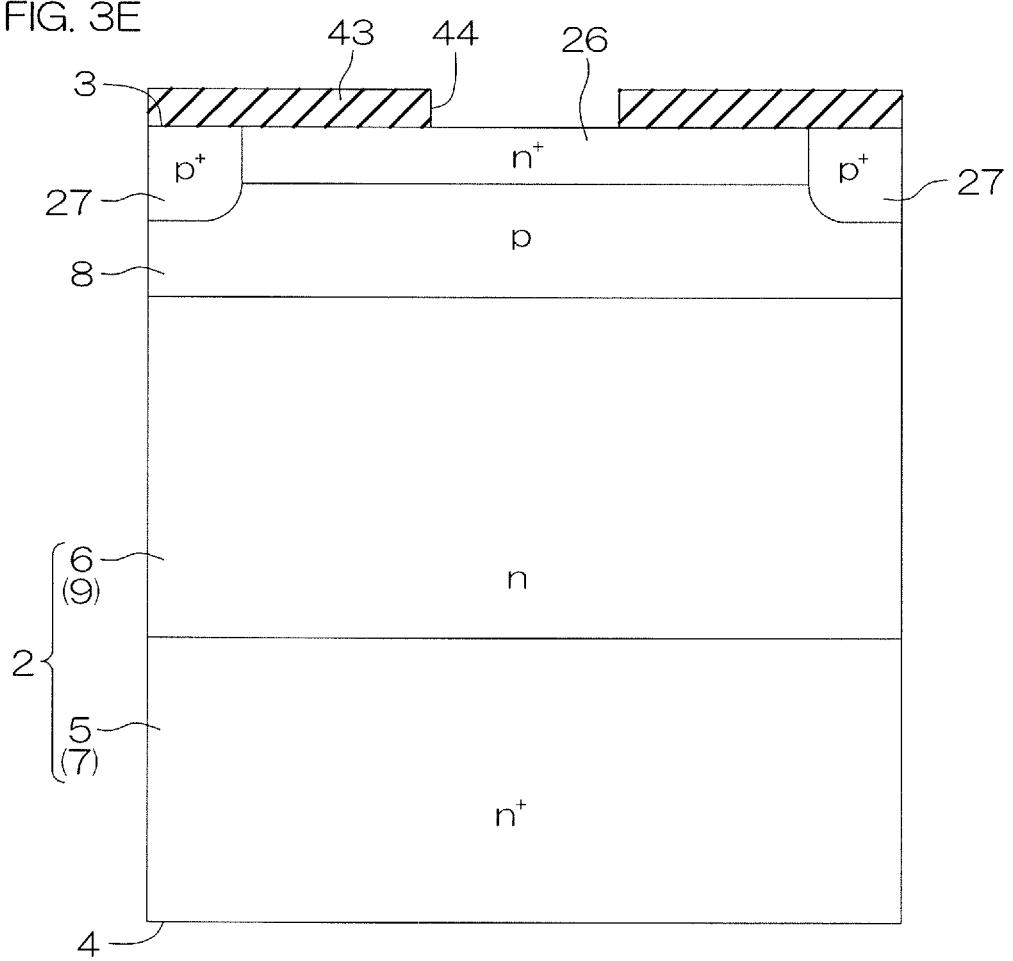

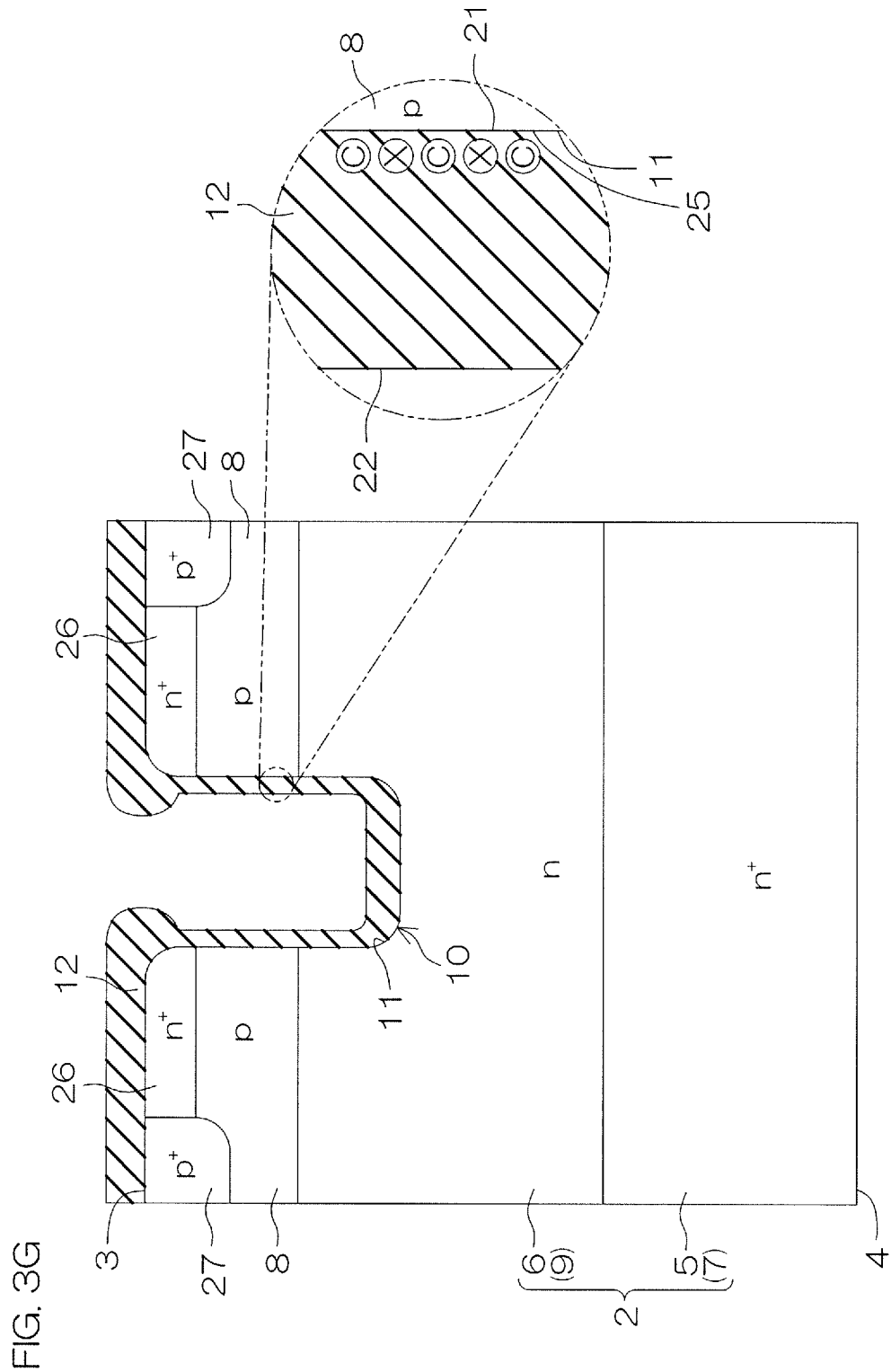

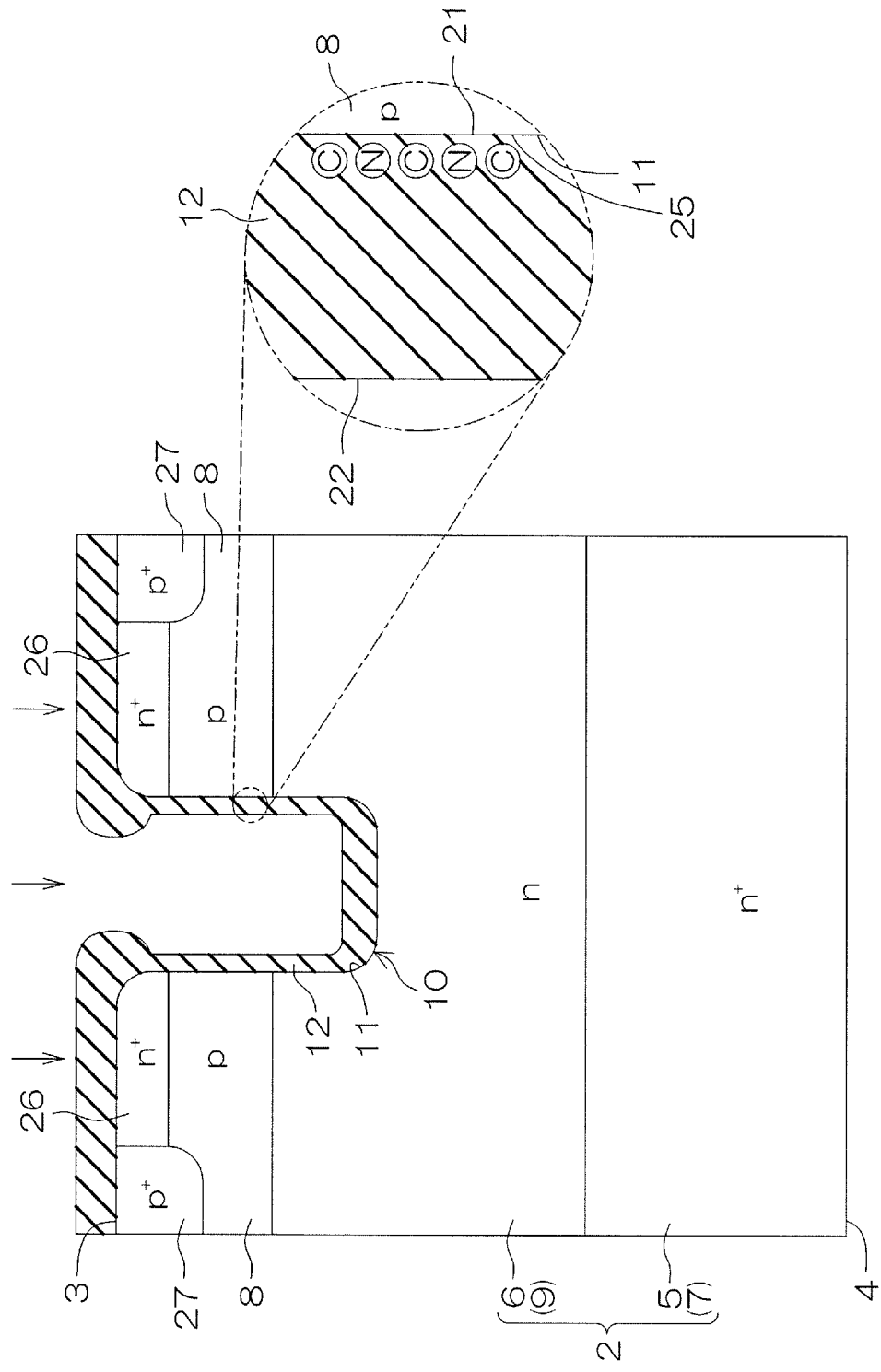

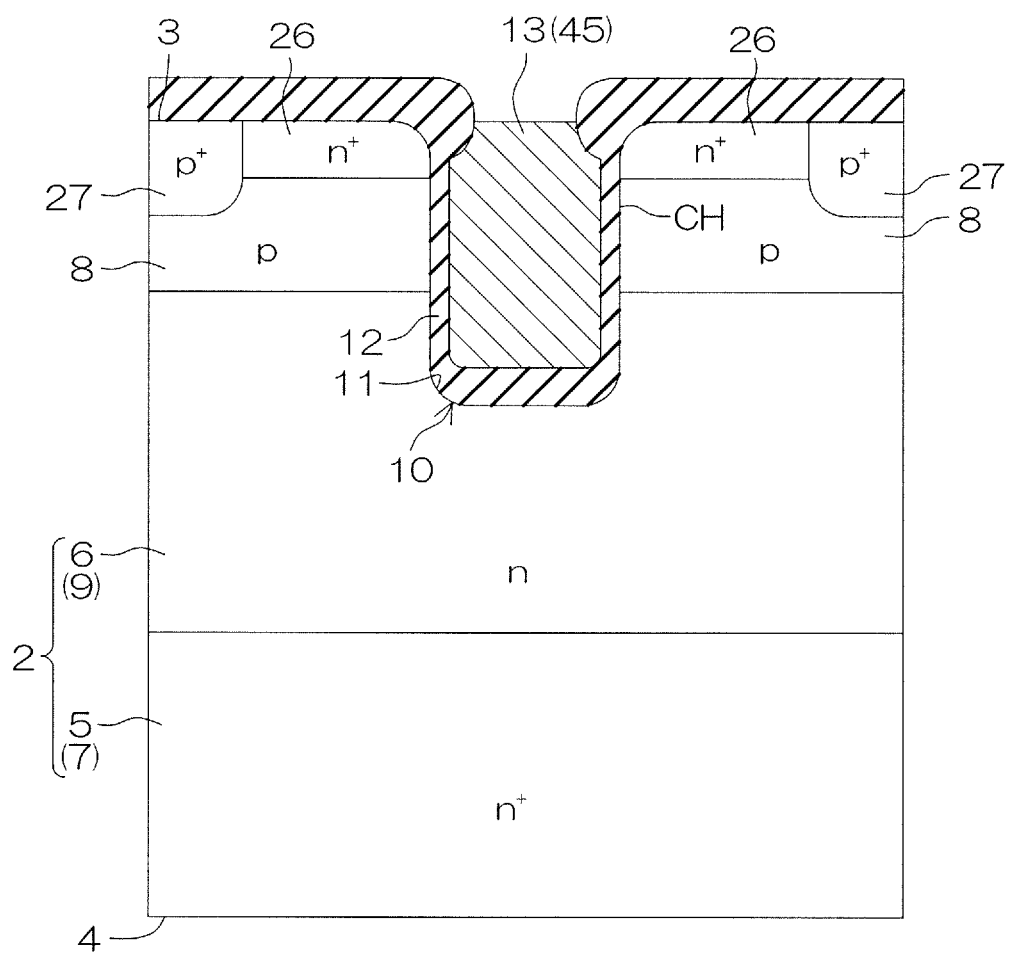

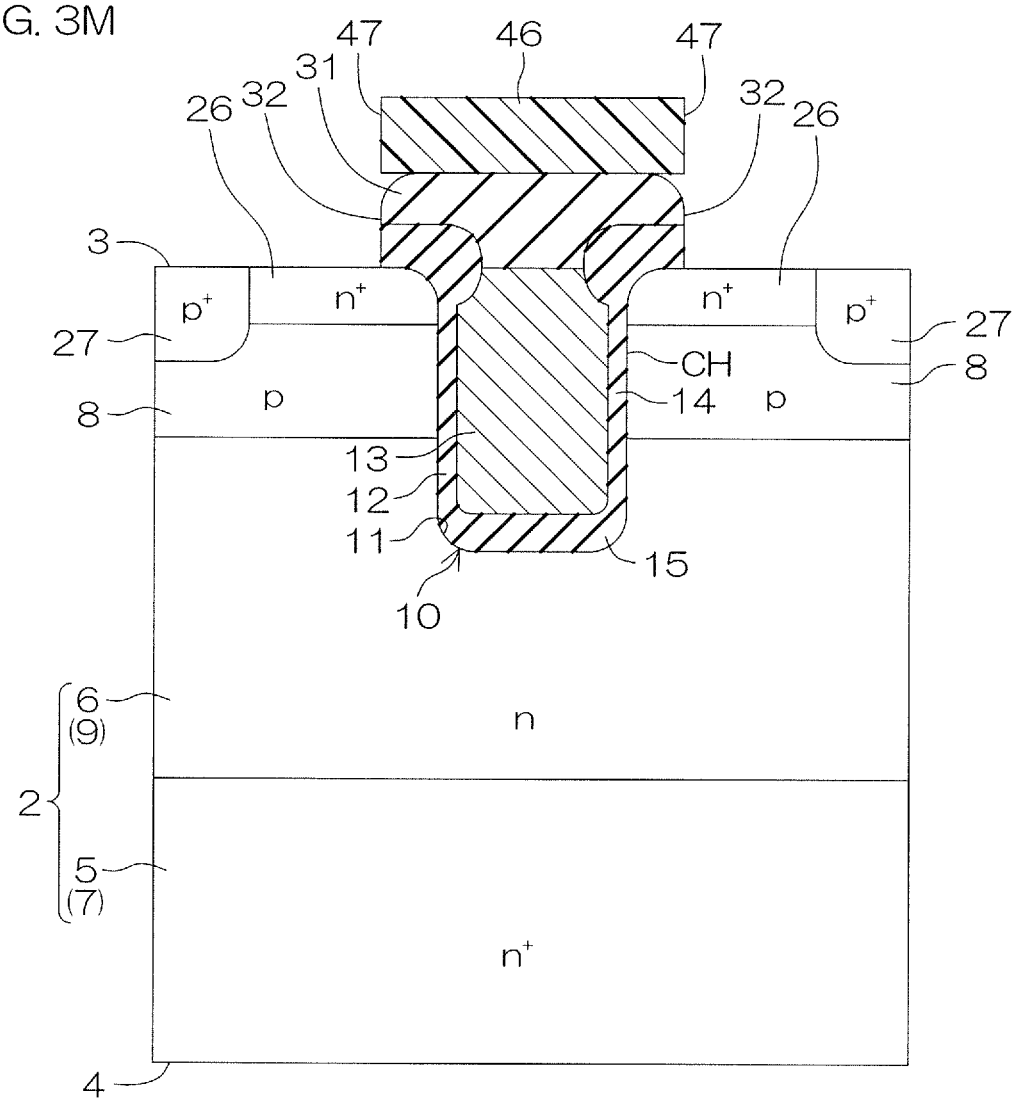

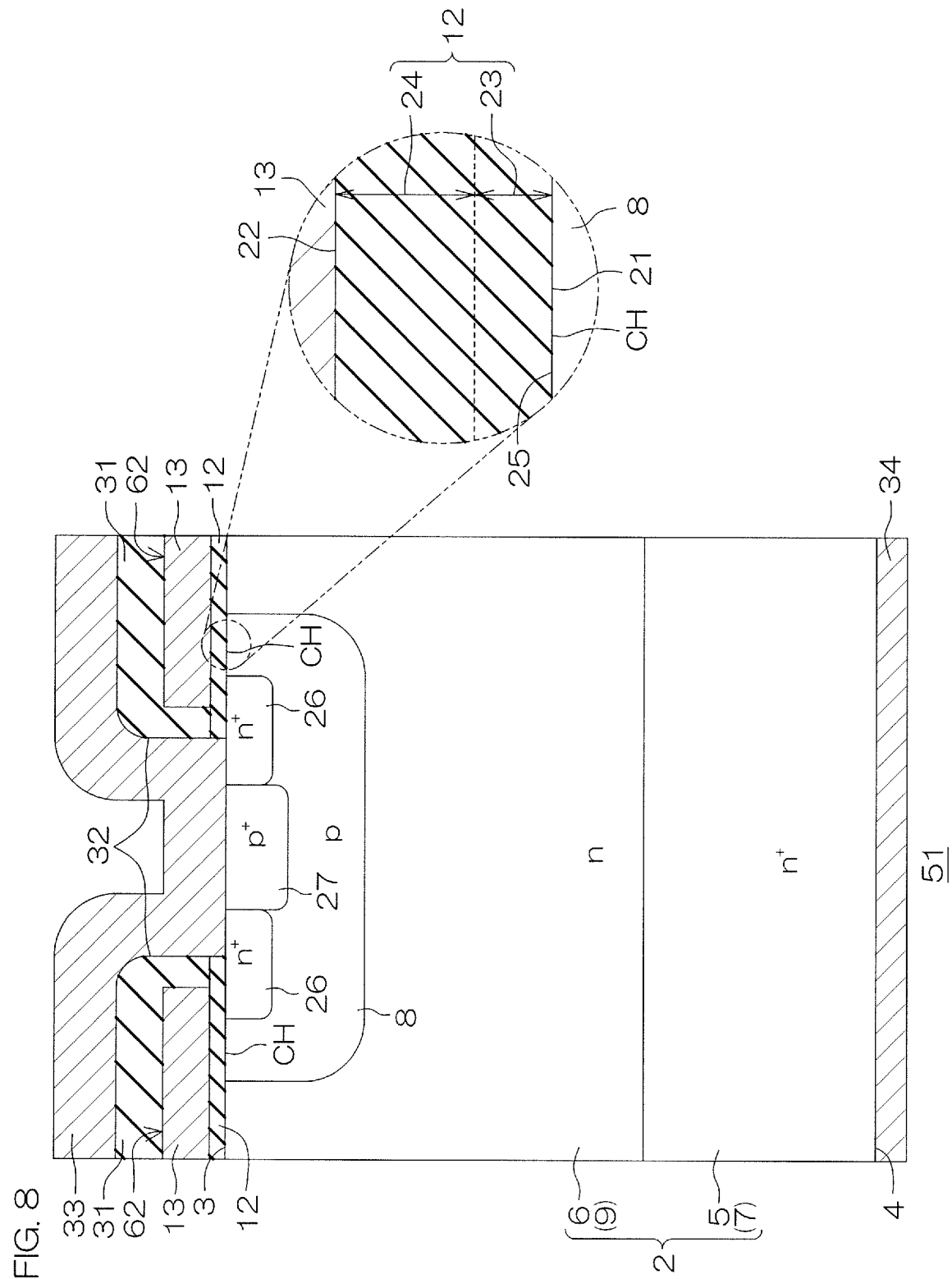

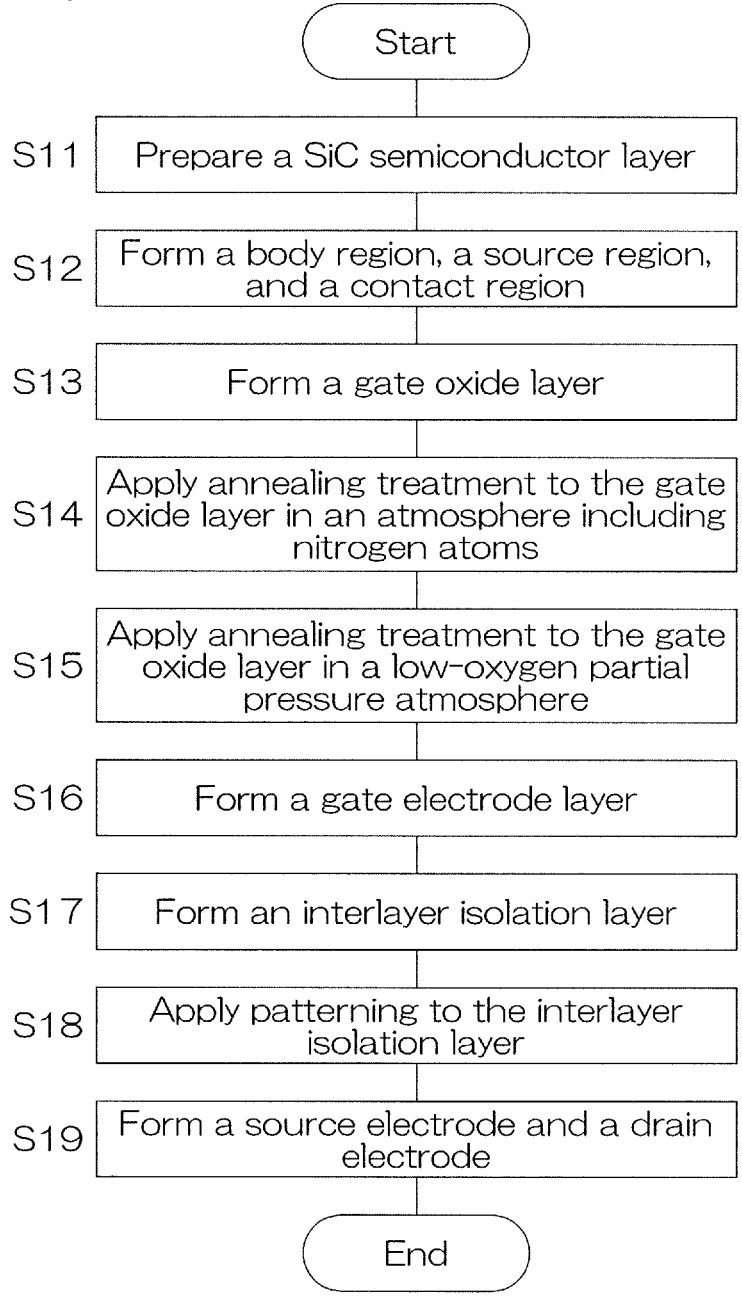

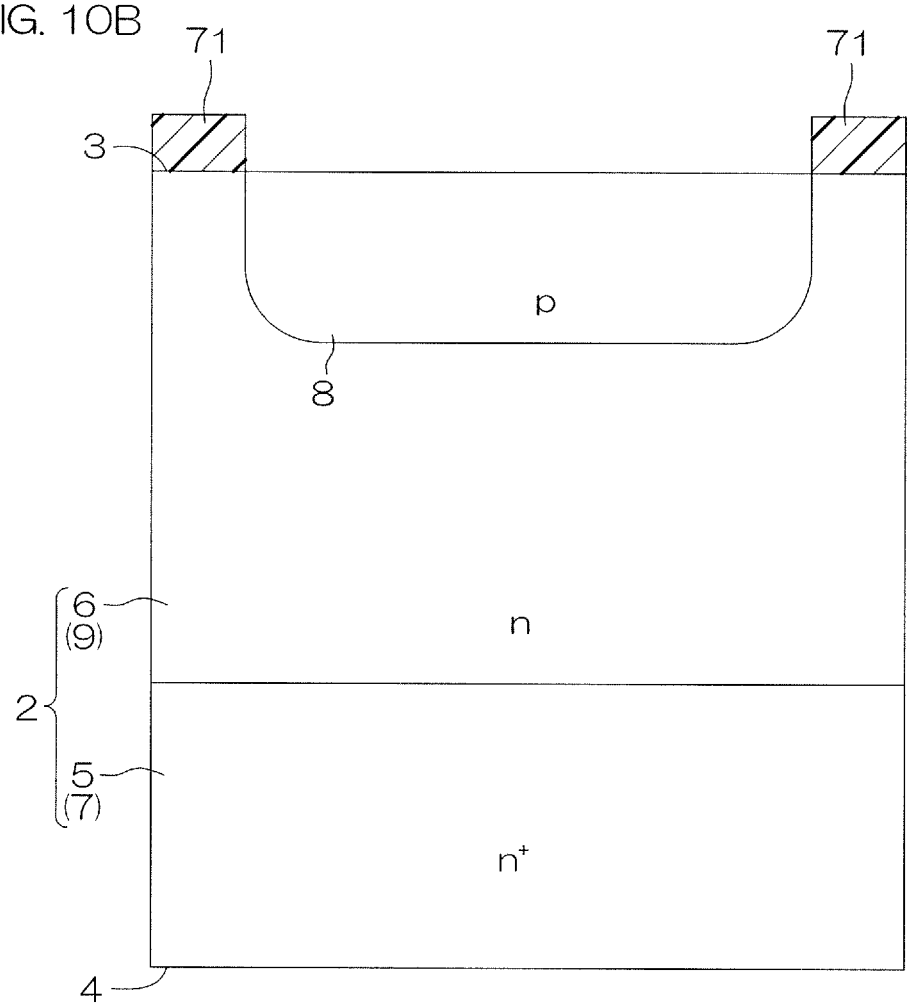

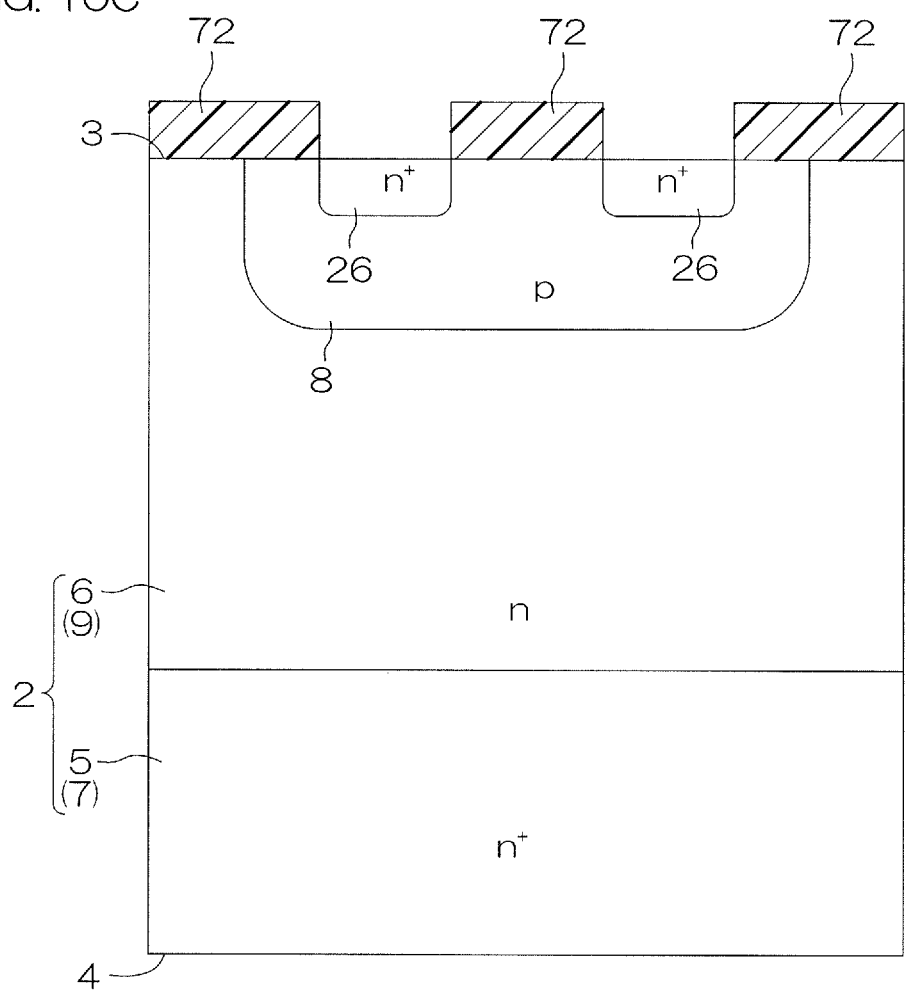

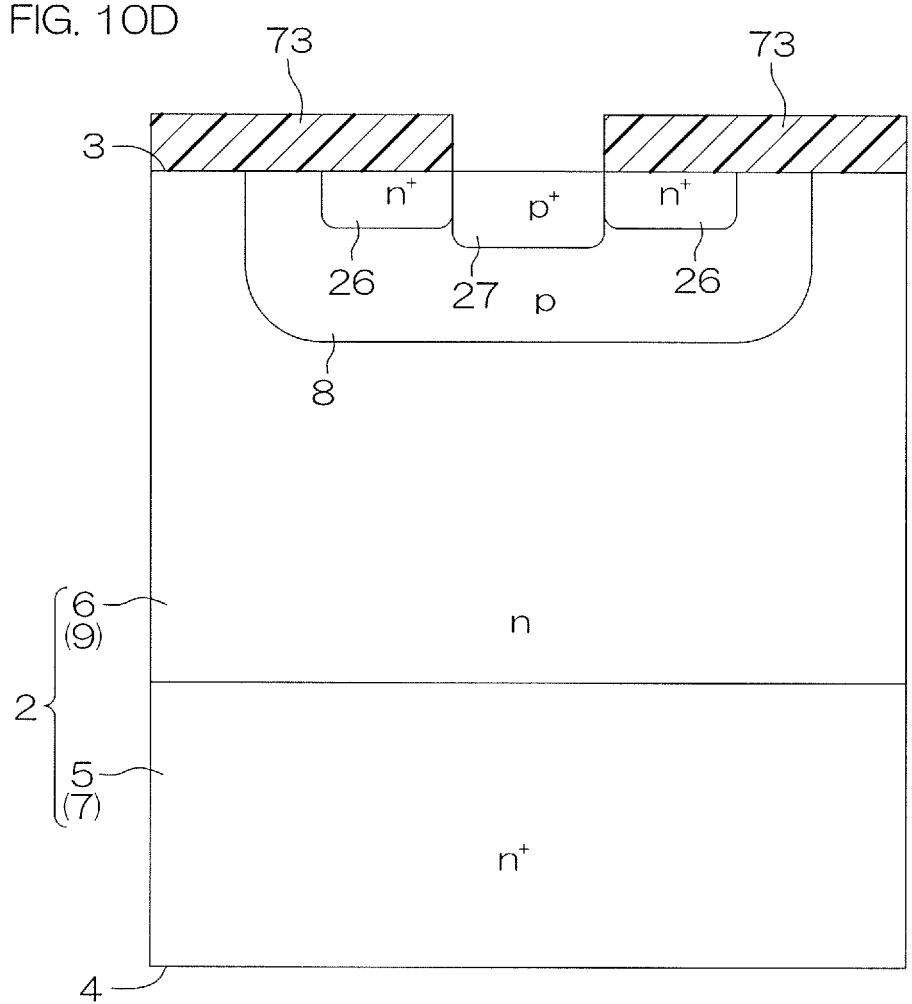

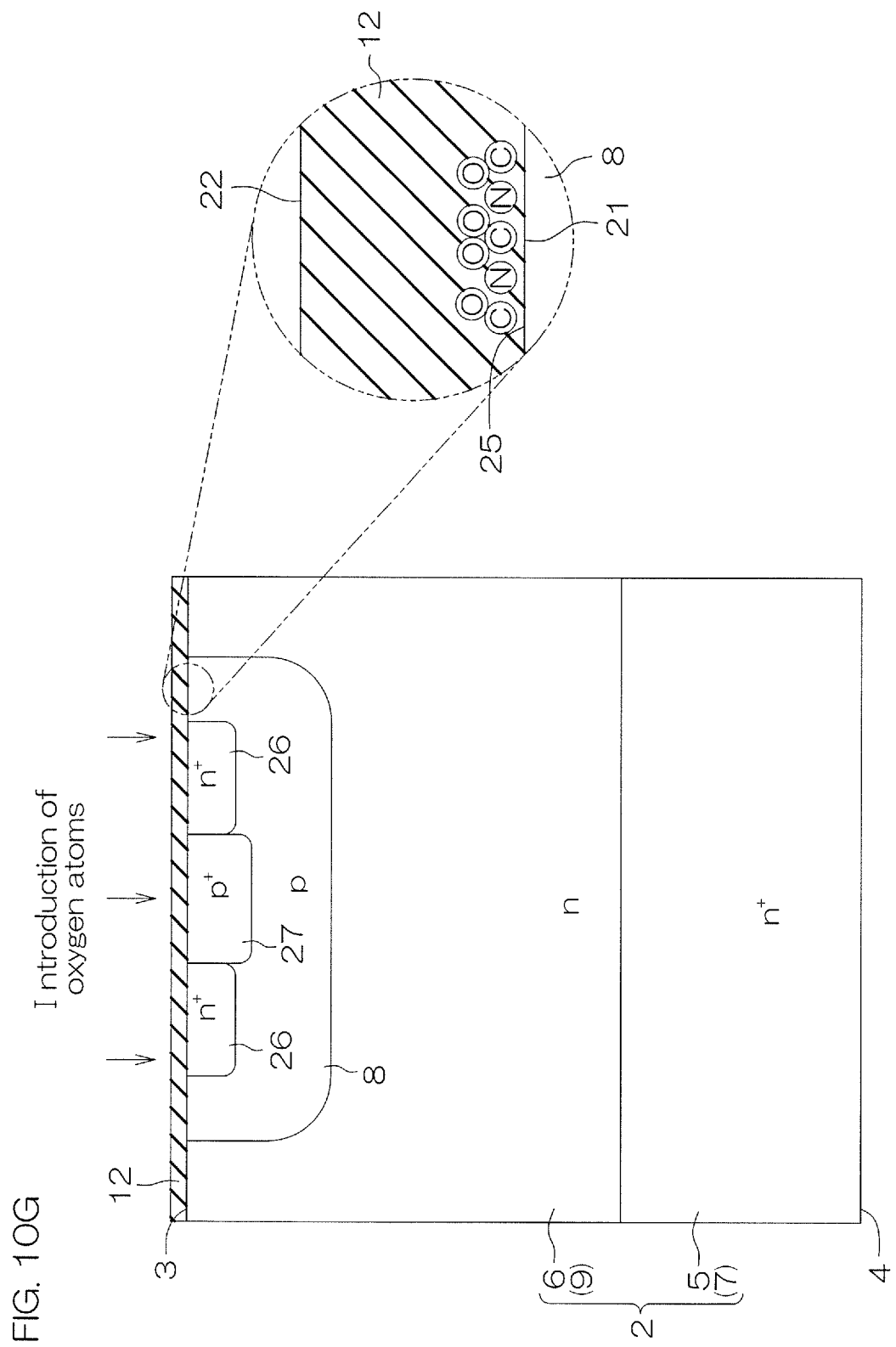

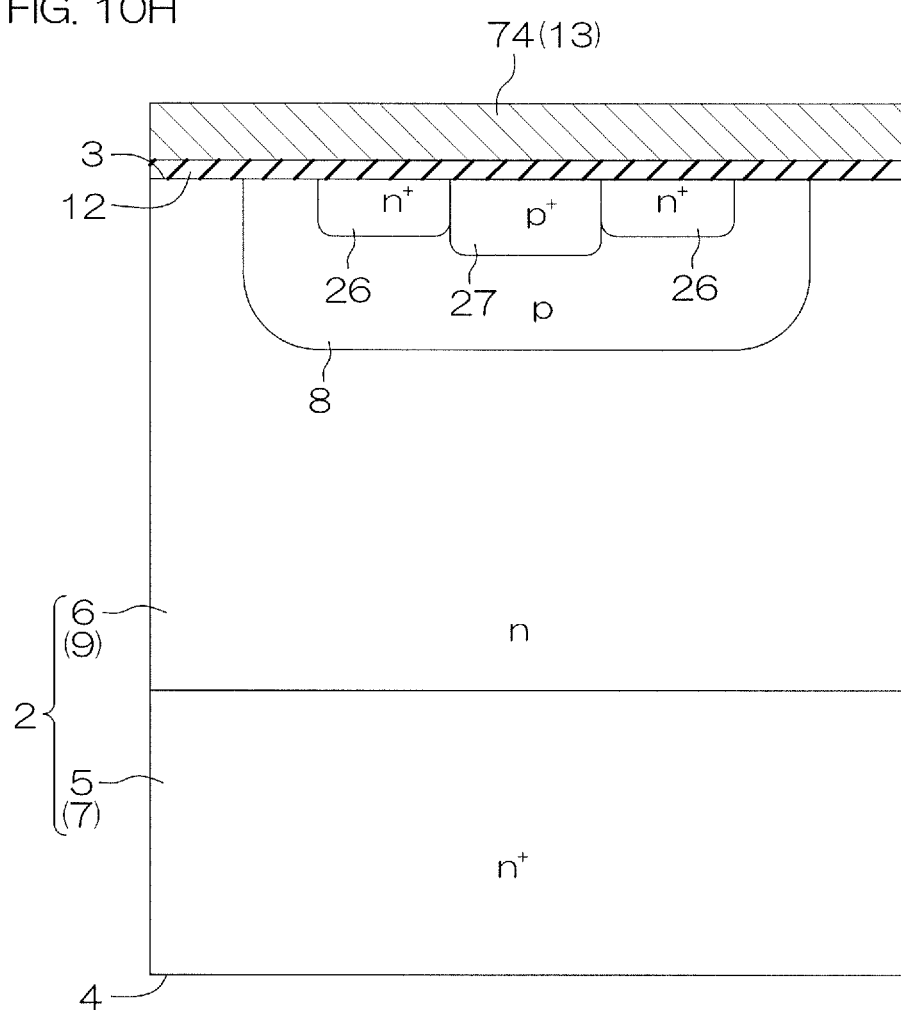

SEMICONDUCTOR DEVICE WITH CARBON-DENSITY-DECREASING REGION

CROSS-REFERENCE TO RELATED APPLICATIONS

This application is a continuation of U.S. application Ser. No. 16/962,160 (now U.S. Pat. No. 11,502,172), filed Jul. 14, 2020, which is based on PCT filing PCT/JP2019/000540, filed Jan. 10, 2019, which claims priority to Japanese Patent Application No. 2018-005735, filed on Jan. 17, 2018, the entire disclosure of each is hereby incorporated by reference herein.

TECHNICAL FIELD

The present invention relates to a semiconductor device that has a structure in which a $SiO_2$ layer is formed on a SiC semiconductor layer, and relates to a method for manufacturing the semiconductor device.

BACKGROUND ART

It has been known that a structure in which a $SiO_2$ layer is formed on a SiC semiconductor layer has the problem of an increase in interface state density in an interfacial region contiguous to the $SiO_2$ layer in the SiC semiconductor layer. Although the interface state density is increased by various causes, interfacial defects in an interfacial region between the SiC semiconductor layer and the $SiO_2$ layer can be mentioned as its one main cause. Such interfacial defects can be produced by carbon atoms existing in the interfacial region.

The interface state density has a correlation with channel mobility (which is also called "carrier mobility"). More specifically, an increase in interface state density causes a decrease in channel mobility. An example of a method for improving the interface state density is disclosed by Patent Literature 1 and Patent Literature 2.

Patent Literature 1 discloses a semiconductor device manufacturing method that includes a step of forming a $SiO_2$ layer on a SiC semiconductor substrate and a step of applying heat treatment onto the $SiO_2$ layer in an inert gas atmosphere including Ar (argon).

Patent Literature 2 discloses a semiconductor device manufacturing method that includes a step of forming a $SiO_2$ layer on a SiC semiconductor substrate and a step of applying heat treatment onto the $SiO_2$ layer and adding phosphorus to the $SiO_2$ layer in an atmosphere including $POCl_3$ (phosphoryl chloride).

CITATION LIST

Patent Literature

Patent Literature 1: Japanese Patent Application Publication No. 2001-345320
Patent Literature 2: International Publication No. WO 2011/074237 A1

SUMMARY OF INVENTION

Technical Problem

According to the manufacturing method of Patent Literature 1, it is possible to detach carbon atoms from an interfacial region contiguous to the $SiO_2$ layer in the SiC semiconductor layer. This makes it possible to reduce interfacial defects. However, in this case, carbon atoms remain in the $SiO_2$ layer, and therefore it is impossible to obtain satisfactory insulating properties.

According to the manufacturing method of Patent Literature 2, it is possible to allow the carbon atoms in the $SiO_2$ layer and the oxygen atoms in the atmosphere to react together. This makes it possible to remove the carbon atoms in the $SiO_2$ layer, hence making it possible to reduce interfacial defects. However, in this case, P (phosphorus) added to the $SiO_2$ layer functions as a charge trap, and therefore there is a fear that time-dependent deterioration of the $SiO_2$ layer will be caused.

A preferred embodiment of the present invention provides a semiconductor device that is capable of reducing interfacial defects between a SiC semiconductor layer and a $SiO_2$ layer and that has a good-quality $SiO_2$ layer, and provides a method for manufacturing the semiconductor device.

Solution to Problem

A preferred embodiment of the present invention provides a semiconductor device that includes a SiC semiconductor layer that has a carbon density of $1.0\times10^{22}$ $cm^{-3}$ or more, a $SiO_2$ layer that is formed on the SiC semiconductor layer and that has a connection surface contiguous to the SiC semiconductor layer and a non-connection surface positioned on a side opposite to the connection surface, a carbon-density-decreasing region that is formed at a surface layer portion of the connection surface of the $SiO_2$ layer and in which a carbon density gradually decreases toward the non-connection surface of the $SiO_2$ layer, and a low carbon density region that is formed at a surface layer portion of the non-connection surface of the $SiO_2$ layer and that has a carbon density of $1.0\times10^{14}$ $cm^{-3}$ or less.

A preferred embodiment of the present invention provides a semiconductor device manufacturing method that includes a step of preparing a SiC semiconductor layer, a step of forming a $SiO_2$ layer on the SiC semiconductor layer, and an oxygen atom introducing step of introducing oxygen atoms into the $SiO_2$ layer by applying annealing treatment in a low-oxygen partial pressure atmosphere.

The aforementioned or yet other objects, features, and effects of the present invention will be clarified by the following description of preferred embodiments given below with reference to the accompanying drawings.

BRIEF DESCRIPTION OF DRAWINGS

FIG. 3E is a cross-sectional view showing a step subsequent to that of FIG. 3D.

FIG. 3G is a cross-sectional view showing a step subsequent to that of FIG. 3F.

FIG. 3H is a cross-sectional view showing a step subsequent to that of FIG. 3G.

FIG. 3K is a cross-sectional view showing a step subsequent to that of FIG. 3J.

FIG. 3M is a cross-sectional view showing a step subsequent to that of FIG. 3L.

FIG. 8 is a cross-sectional view showing a region in which a planar-gate type MISFET is formed in a semiconductor device according to a second preferred embodiment of the present invention.

FIG. 9 is a flowchart to describe an example of a method for manufacturing the semiconductor device shown in FIG. 8.

FIG. 10B is a cross-sectional view showing a step subsequent to that of FIG. 10A.

FIG. 10C is a cross-sectional view showing a step subsequent to that of FIG. 10B.

FIG. 10D is a cross-sectional view showing a step subsequent to that of FIG. 10C.

FIG. 10G is a cross-sectional view showing a step subsequent to that of FIG. 10F.

FIG. 10H is a cross-sectional view showing a step subsequent to that of FIG. 10G.

DESCRIPTION OF EMBODIMENTS

Figure 1:
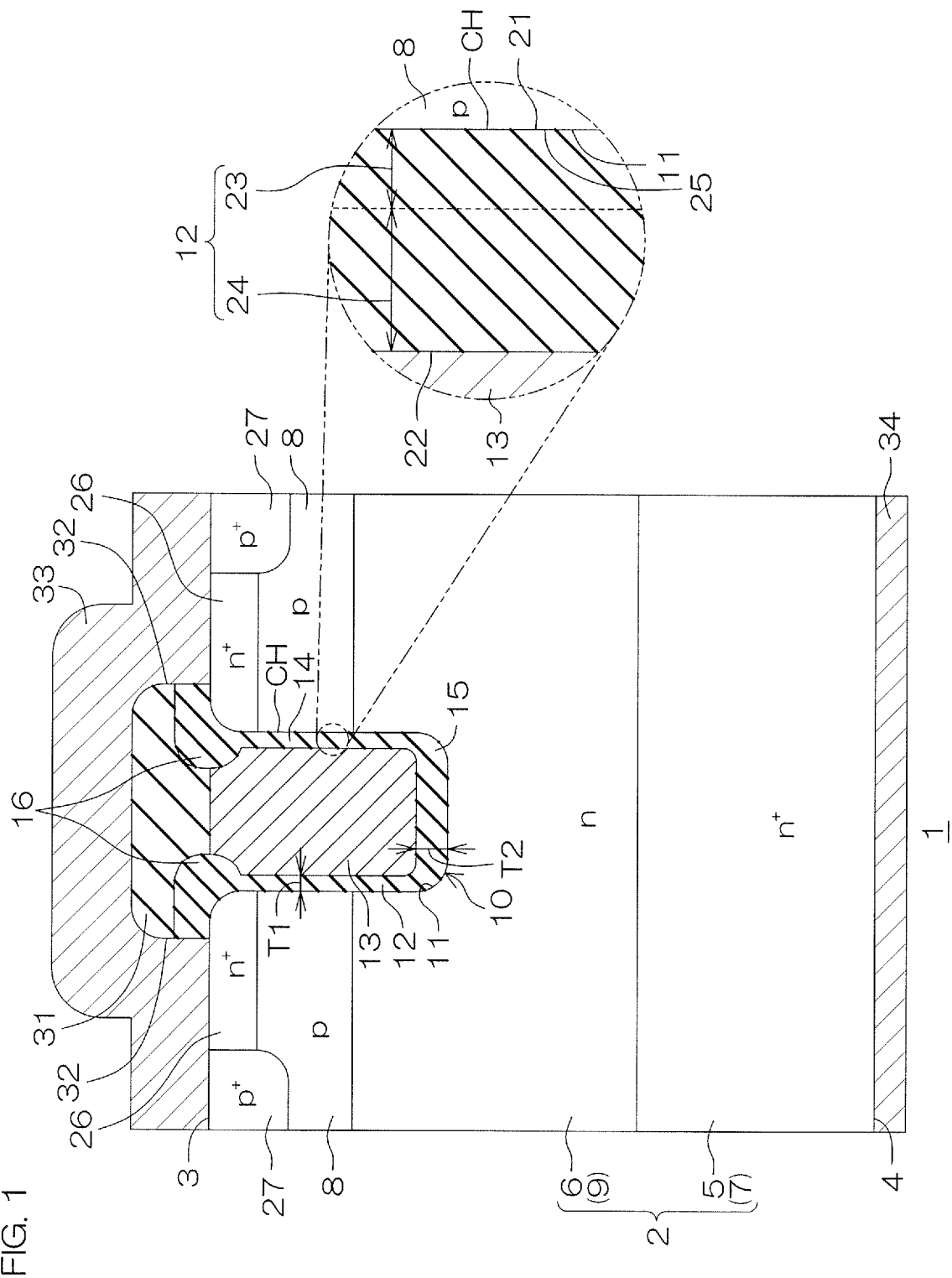
FIG. 1 is a cross-sectional view showing a region in which a trench-gate type MISFET is formed in a semiconductor device according to a first preferred embodiment of the present invention.

FIG. 1 is a cross-sectional view showing a region in which a MISFET is formed in a semiconductor device 1 according to a first preferred embodiment of the present invention.

The semiconductor device 1 has a basic form including a trench-gate type MISFET (Metal Insulator Semiconductor Field Effect Transistor). The semiconductor device 1 includes an n type SiC semiconductor layer 2 to which an n type impurity is added. The SiC semiconductor layer 2 is made of 4H-SiC monocrystal in the present preferred embodiment. The n type impurity of the SiC semiconductor layer 2 may be N (nitrogen), As (arsenic), or P (phosphorus).

The SiC semiconductor layer 2 includes a first main surface 3 on one side and a second main surface 4 on the other side. The first main surface 3 and the second main surface 4 may each have an off-angle that is tilted at an angle of 10° or less in a <11-20> direction with respect to a [0001] plane of the 4H-SiC monocrystal. The off-angle is also an angle between a normal direction of both the first main surface 3 and the second main surface 4 and a c axis of the 4H-SiC monocrystal.

The off-angle may be not less than 0° and not more than 4°. The off-angle having an angle of 0° creates a state in which the normal direction of the first main surface 3 and the c axis of the 4H-SiC monocrystal coincide with each other. The off-angle may be more than 0° and less than 4°. Typically, the off-angle is set within the range of 2°±10% or 4°±10%.

More specifically, the SiC semiconductor layer 2 has a layered structure including a SiC semiconductor substrate 5 and a SiC epitaxial layer 6. The SiC semiconductor substrate 5 forms the second main surface 4 of the SiC semiconductor layer 2. The SiC epitaxial layer 6 forms the first main surface 3 of the SiC semiconductor layer 2.

The SiC semiconductor substrate 5 is made of an $n^+$ type 4H-SiC monocrystalline substrate. The main surface of the 4H-SiC monocrystalline substrate may have an off-angle that is tilted at an angle of 10° or less in the <11-20> direction with respect to the [0001] plane. More specifically, the off-angle is not less than 0° and not more than 4° (e.g., 2° or 4°).

The SiC semiconductor substrate 5 is formed as a drain region 7 of the MISFET. The n type impurity concentration of the SiC semiconductor substrate 5 may be not less than $1.0 \times 10^{-3}$ cm$^{-3}$ and not more than $1.0 \times 10^{21}$ cm$^{-3}$ (e.g., about $1.0 \times 10^{18}$ cm$^{-3}$).

The SiC epitaxial layer 6 is made of an n type 4H-SiC monocrystal layer that has the aforementioned off-angle. The SiC epitaxial layer 6 has an n type impurity concentration less than the n type impurity concentration of the SiC semiconductor substrate 5. The n type impurity concentration of the SiC epitaxial layer 6 may be not less than $1.0 \times 10^{15}$ cm$^{-3}$ and not more than $1.0 \times 10^{17}$ cm$^{-3}$ (e.g., about $1.0 \times 10^{16}$ cm$^{-3}$). The carbon density of the SiC epitaxial layer 6 may be not less than $1.0 \times 10^{22}$ cm$^{-3}$ and not more than $1.0 \times 10^{24}$ cm$^{-3}$ (e.g., about $5.0 \times 10^{22}$ cm$^{-3}$).

A p type body region 8 is formed at a surface layer portion of the first main surface 3 of the SiC semiconductor layer 2. The body region 8 is formed so as to have an interval to the first main surface 3 side with respect to the SiC semiconductor substrate 5. A region between the SiC semiconductor substrate 5 and the body region 8 is formed as a drift region 9 in the SiC epitaxial layer 6.

A trench gate structure 10 is formed at the surface layer portion of the first main surface 3. The trench gate structure 10 includes a gate trench 11, a gate oxide layer 12, and a gate electrode layer 13. The gate trench 11 passes through the body region 8 from the first main surface 3, and reaches the drift region 9. In the gate trench 11, a corner portion by which a side wall and a bottom wall are connected together may have a curved plane.

The gate oxide layer 12 is formed as an example of a $SiO_2$ (silicon oxide) layer. The gate oxide layer 12 is formed in a film shape along an inner wall surface of the gate trench 11, and defines a recessed space in the gate trench 11. The gate oxide layer 12 may integrally have a coating portion that is drawn out from the gate trench 11 and with which the first main surface 3 is coated.

The gate oxide layer 12 has a connection surface 21 contiguous to the SiC semiconductor layer 2 and a non-connection surface 22 positioned on the side opposite to the connection surface 21. The gate oxide layer 12 may have a thickness of not less than 20 nm and not more than 500 nm. Preferably, the thickness of the gate oxide layer 12 is 150 nm or less. More preferably, the thickness of the gate oxide layer 12 is 100 nm or less.

The thickness of the gate oxide layer 12 is a thickness between the connection surface 21 and the non-connection surface 22. The thickness of the gate oxide layer 12 is also a thickness along the normal direction of the inner wall surface of the gate trench 11 in the present preferred embodiment. In other words, the thickness direction of the gate oxide layer 12 coincides with the normal direction of the inner wall surface of the gate trench 11.

The gate oxide layer 12 includes a first region 14 and a second region 15 in the present preferred embodiment. The first region 14 is formed along the side wall of the gate trench 11. The second region 15 is formed along the bottom wall of the gate trench 11. The second region 15 has a second thickness T2 that is equal to a first thickness T1 of the first region 14 or more. The ratio T2/T1 of the second thickness T2 to the first thickness T1 may be not less than 1 and not more than 3.

The first thickness T1 may be not less than 20 nm and not more than 200 nm. Preferably, the first thickness T1 is 150 nm or less. More preferably, the first thickness T1 is 100 nm or less. The second thickness T2 may be not less than 20 nm and not more than 500 nm. The first region 14 may have a uniform thickness. The second region 15 may have a uniform thickness. If the first thickness T1 is equal to the second thickness T2, the first region 14 and the second region 15 are both formed with a uniform thickness.

The gate oxide layer 12 includes a bulge portion 16 formed along a corner portion on an open side of the gate trench 11 in the present preferred embodiment. The bulge portion 16 projects toward an inward side of the gate trench 11 in a curved shape. The bulge portion 16 narrows the opening of the gate trench 11 in an opening portion of the gate trench 11.

The gate oxide layer 12 includes a carbon-density-decreasing region 23 and a low carbon density region 24. The carbon-density-decreasing region 23 and the low carbon density region 24 each include carbon atoms that have diffused from the gate oxide layer 12.

The carbon-density-decreasing region 23 and the low carbon density region 24 are formed in a region contiguous to, at least, the body region 8 (a channel CH of the MISFET described later) in the gate oxide layer 12. The carbon-density-decreasing region 23 and the low carbon density region 24 are also formed in a region contiguous to the drift region 9 or to a source region 26 described later in the gate oxide layer 12. The carbon-density-decreasing region 23 and the low carbon density region 24 are uniformly formed in the gate oxide layer 12.

More specifically, the carbon-density-decreasing region 23 is formed at a surface layer portion of the connection surface 21 of the gate oxide layer 12. The carbon-density-decreasing region 23 has a carbon density that gradually decreases from the carbon density ($1.0 \times 10^{22}$ $cm^{-3}$ or more) of the SiC epitaxial layer 6 to $1.0 \times 10^{19}$ $cm^{-3}$ or less from the connection surface 21 toward the non-connection surface 22. The thickness of the carbon-density-decreasing region 23 based on the connection surface 21 of the gate oxide layer 12 is not less than 0.15 nm and not more than 25 nm in the present preferred embodiment.

The low carbon density region 24 is formed at a surface layer portion of the non-connection surface 22 of the gate oxide layer 12. More specifically, the low carbon density region 24 is formed in a region between the non-connection surface 22 and the carbon-density-decreasing region 23 in the gate oxide layer 12.

The low carbon density region 24 has a thickness obtained by subtracting the thickness of the carbon-density-decreasing region 23 from the thickness of the gate oxide layer 12. With respect to the thickness direction of the gate oxide layer 12, a ratio for which the low carbon density region 24 accounts in the gate oxide layer 12 is equal to or more than a ratio for which the carbon-density-decreasing region 23 accounts in the gate oxide layer 12. In other words, the low carbon density region 24 has a thickness equal to or more than the thickness of the low carbon density region 24.

More specifically, with respect to the thickness direction of the gate oxide layer 12, a ratio for which the low carbon density region 24 accounts in the gate oxide layer 12 is larger than a ratio for which the carbon-density-decreasing region 23 accounts in the gate oxide layer 12. In other words, the low carbon density region 24 has a thickness exceeding the thickness of the low carbon density region 24.

The low carbon density region 24 has a carbon density equal to $1.0 \times 10^{19}$ $cm^{-3}$ or less. More specifically, the carbon density of the low carbon density region 24 is less than $1.0 \times 10^{19}$ $cm^{-3}$. Even more specifically, the carbon density of the low carbon density region 24 has a minimum value that exceeds $1.0 \times 10^{17}$ $cm^{-3}$ and that is not more than $1.0 \times 10^8$ $cm^{-3}$. The minimum value of the low carbon density region 24 is positioned substantially at the center in the thickness direction of the gate oxide layer 12.

The low carbon density region 24 includes a first region that has a comparatively high carbon density and a second region that has a lower carbon density than the first region. The first region is positioned on the non-connection surface 22 side, and the second region is positioned on the connection surface 21 side. More specifically, the second region is positioned in a region between the first region and the low carbon density region 24.

The first region has a carbon density that exceeds $1.0 \times 10^{18}$ $cm^{-3}$ and that is not more than $1.0 \times 10^{19}$ $cm^{-3}$. The second region has a carbon density that exceeds $1.0 \times 10^{17}$ $cm^{-3}$ and that is not more than $1.0 \times 10^{18}$ $cm^{-3}$. The minimum value of the low carbon density region 24 is positioned in the second region.

As an example, the first region may have a thickness that is not less than 5 nm and not more than 20 nm. The first region may have a thickness that is not less than 5 nm and not more than 10 nm, or that is not less than 10 nm and not more than 15 nm, or that is not less than 15 nm and not more than 20 nm. Preferably, the first region has a thickness equal to 10 nm or more.

The thickness of the second region depends on the thickness of the gate oxide layer 12. As an example, the second region may have a thickness that is not less than 5 nm and not more than 50 nm. The second region may have a thickness that is not less than 5 nm and not more than 10 nm, or not less than 10 nm and not more than 15 nm, or not less than 15 nm and not more than 20 nm, or not less than 15 nm and not more than 20 nm, or not less than 20 nm and not more than 25 nm, or not less than 25 nm and not more than 30 nm, or not less than 30 nm and not more than 35 nm, or not less than 35 nm and not more than 40 nm, or not less than 40 nm and not more than 45 nm, or not less than 45 nm and not more than 50 nm. The second region may have a thickness that is not less than 5 nm and not more than 20 nm.

Preferably, the second region has a thickness of 10 nm or more. Preferably, the second region is formed at a depth position at least 10 nm or more away from the non-connection surface 22 toward the connection surface 21 in the gate oxide layer 12.

P (phosphorus) is not added to the low carbon density region 24 and to the carbon-density-decreasing region 23 (i.e., the gate oxide layer 12). "Diffused" is not included in the term "Added". In other words, if P (phosphorus) serving as an n type impurity is included in the SiC semiconductor layer 2 and if P (phosphorus) serving as the n type impurity diffuses into the gate oxide layer 12, this diffusion does not denote that P (phosphorus) has been added to the gate oxide layer 12.

If the gate oxide layer 12 includes P (phosphorus) as an n type impurity, the n type impurity concentration of the gate oxide layer 12 (phosphorus density) is less than the n type impurity concentration (phosphorus density) of the SiC semiconductor layer 2 (i.e., the SiC epitaxial layer 6). In this case, the n type impurity concentration (phosphorus density) of the gate oxide layer 12 has a profile that gradually decreases from the connection surface 21 toward the non-connection surface 22. This profile is formed by the diffusion of P (phosphorus) from the SiC semiconductor layer 2. The n type impurity concentration (phosphorus density) of the gate oxide layer 12 is less than $1.0 \times 10^{16}$ cm$^{-3}$.

Referring again to FIG. 1, the gate electrode layer 13 is buried in the gate trench 11 with the gate oxide layer 12 therebetween. More specifically, the gate electrode layer 13 is buried in a recessed space defined by the gate oxide layer 12 in the gate trench 11.

An upper end portion of the gate electrode layer 13 is contiguous to the bulge portion 16 of the gate oxide layer 12. Hence, the upper end portion of the gate electrode layer 13 has a constricted portion that becomes hollow along the bulge portion 16 of the gate oxide layer 12. The gate electrode layer 13 may include at least one among tungsten, titanium, titanium nitride, molybdenum and electroconductive polysilicon.

An interfacial region 25 is formed at an interface contiguous to the gate oxide layer 12 in the SiC semiconductor layer 2. The interfacial region 25 includes nitrogen atoms in the present preferred embodiment. More specifically, the interfacial region 25 is a nitrogen-terminated surface terminated by nitrogen atoms. The nitrogen density of the interfacial region 25 may be not less than $5.0 \times 10^{18}$ cm$^{-3}$ and not more than $5.0 \times 10^{21}$ cm$^{-3}$ (e.g., about $5.0 \times 10^{20}$ cm$^{-3}$). These nitrogen atoms diffuse into the interfacial region 25 through the gate oxide layer 12. The nitrogen atom density on the connection surface 21 side of the gate oxide layer 12 is larger than the nitrogen atom density on the non-connection surface 22 side of the gate oxide layer 12.

An n$^+$ type source region 26 is formed in a region along the side wall of the gate trench 11 in a surface layer portion of the body region 8. The n type impurity concentration of the source region 26 may be not less than $1.0 \times 10^{15}$ cm$^{-3}$ and not more than $1.0 \times 10^{21}$ cm$^{-3}$ (e.g., about $1.0 \times 10^{19}$ cm$^{-3}$). The n type impurity of the source region 26 may be As (arsenic) or P (phosphorus).

A p$^+$ type contact region 27 is formed in a region having an interval from the side wall of the gate trench 11 in the surface layer portion of the body region 8. The p$^+$ type contact region 27 is electrically connected to the body region 8. The contact region 27 passes through the source region 26 from the first main surface 3, and reaches the body region 8.

As thus described, in the region along the side wall of the gate trench 11 in the surface layer portion of the first main surface 3, the source region 26, the body region 8, and the drift region 9 are formed in this order from the first main surface 3 toward the second-main surface-4 side. The channel CH of the MISFET is formed in a region facing the gate electrode layer 13 with the gate oxide layer 12 therebetween in the body region 8.

An interlayer isolation layer 31 is formed on the first main surface 3. The interlayer isolation layer 31 may include silicon oxide or silicon nitride. The interlayer isolation layer 31 includes silicon oxide in the present preferred embodiment. The interlayer isolation layer 31 coats the trench gate structure 10 and an arbitrary region of the first main surface 3. Contact holes 32 are formed in the interlayer isolation layer 31. The contact holes 32 expose the source region 26 and the contact region 27.

A source electrode 33 is formed on the interlayer isolation layer 31. The source electrode 33 enters the contact holes 32 from on the interlayer isolation layer 31. The source electrode 33 is connected to the source region 26 and to the contact region 27 in the contact holes 32. A drain electrode 34 is connected to the second main surface 4 of the SiC semiconductor layer 2.

Figure 2:
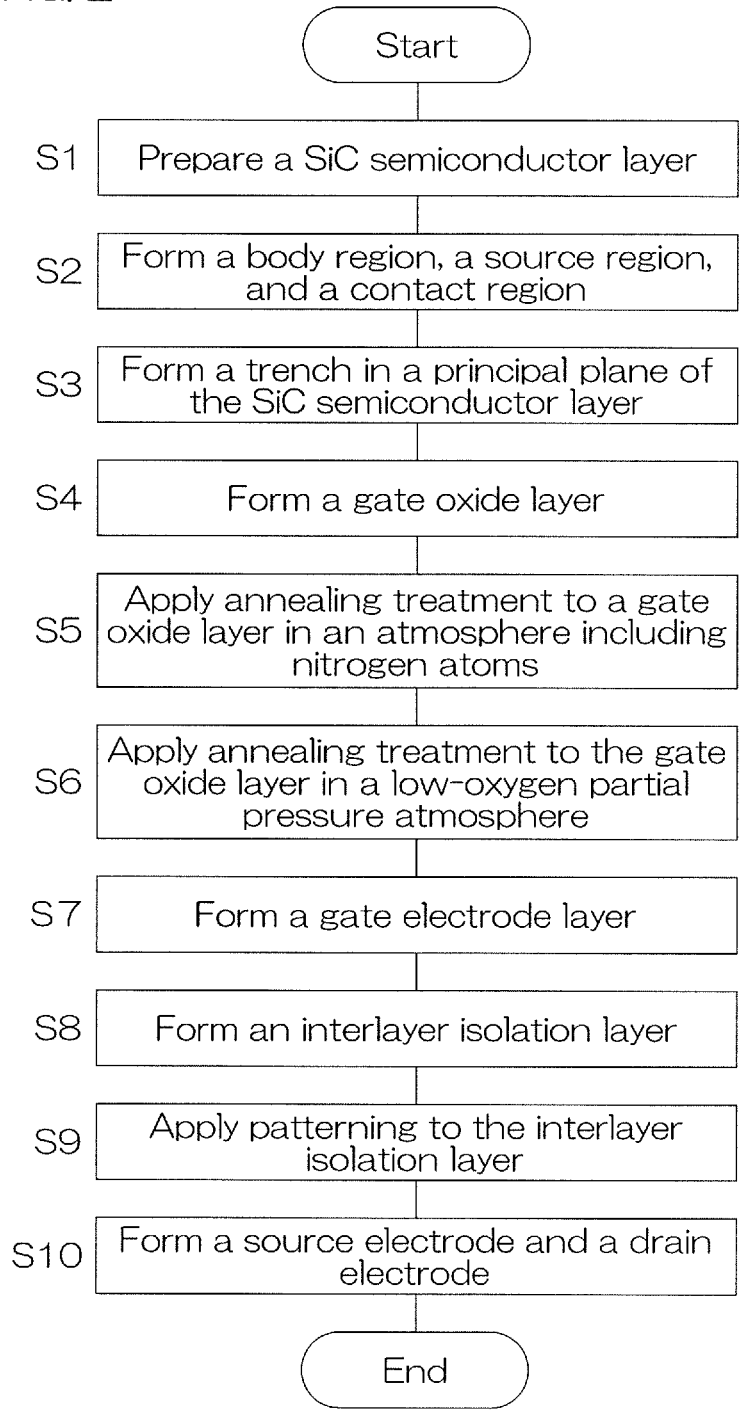
FIG. 2 is a flowchart to describe an example of a method for manufacturing the semiconductor device shown in FIG. 1.
Figure 3A:
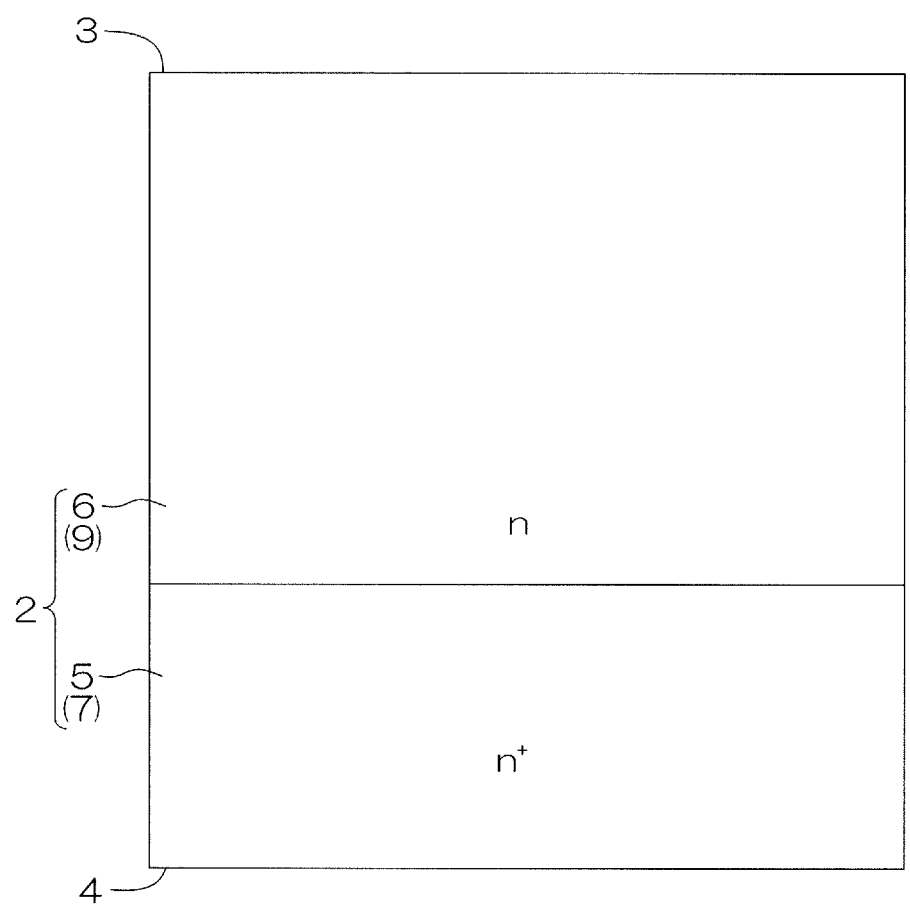
FIG. 3A is a cross-sectional view to describe an example of a method for manufacturing the semiconductor device shown in FIG. 1.

FIG. 2 is a flowchart to describe an example of a method for manufacturing the semiconductor device 1 shown in FIG. 1. FIG. 3A to FIG. 3N are cross-sectional views to describe an example of a method for manufacturing the semiconductor device 1 shown in FIG. 1.

Referring to FIG. 3A, the SiC semiconductor layer 2 is prepared (step S1 of FIG. 2). The SiC semiconductor layer 2 is formed through a step of preparing the SiC semiconductor substrate 5 and through a step of forming the SiC epitaxial layer 6 on a main surface of the SiC semiconductor substrate 5. The SiC epitaxial layer 6 is formed by epitaxially growing SiC from the main surface of the SiC semiconductor substrate 5.

Figure 3B:
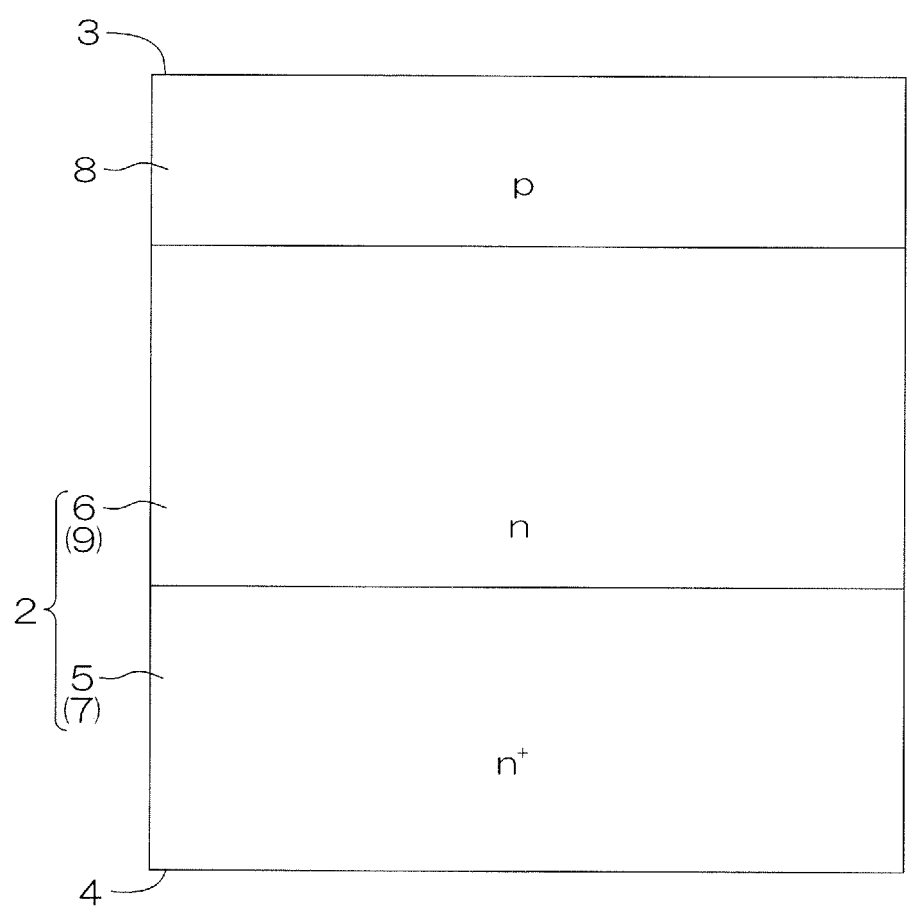
FIG. 3B is a cross-sectional view showing a step subsequent to that of FIG. 3A.

Thereafter, referring to FIG. 3B, the p type body region 8 is formed at the surface layer portion of the first main surface 3 of the SiC semiconductor layer 2 (step S2 of FIG. 2). The step of forming the body region 8 includes a step of introducing a p type impurity into the surface layer portion of the first main surface 3. The p type impurity may be introduced into the surface layer portion of the first main surface 3 according to an ion implantation method.

Figure 3C:
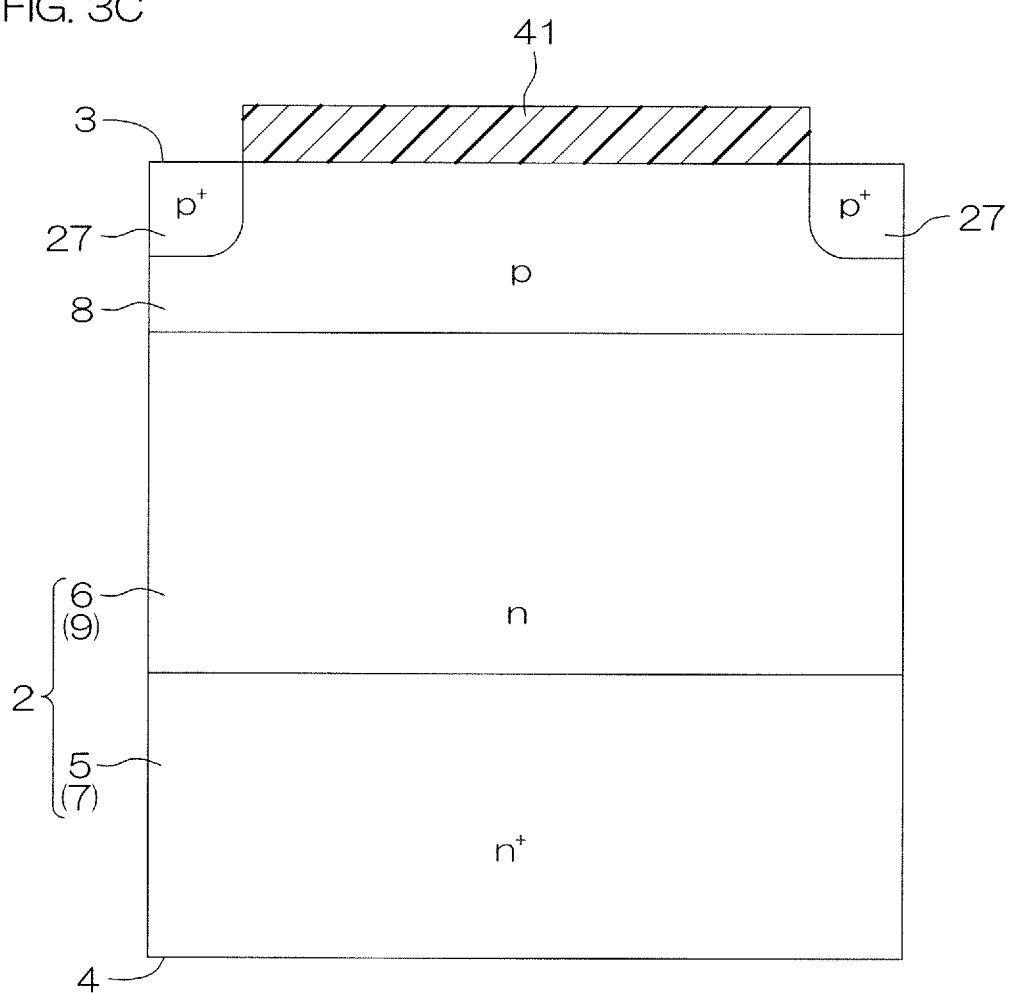
FIG. 3C is a cross-sectional view showing a step subsequent to that of FIG. 3B.

Thereafter, referring to FIG. 3C, the p$^+$ type contact region 27 is formed at the surface layer portion of the body region 8 (step S2 of FIG. 2). The step of forming the contact region 27 includes a step of introduces a p type impurity into the surface layer portion of the body region 8. The p type impurity may be introduced into the surface layer portion of the body region 8 according to the ion implantation method in which an ion implantation mask 41 is used.

Figure 3D:
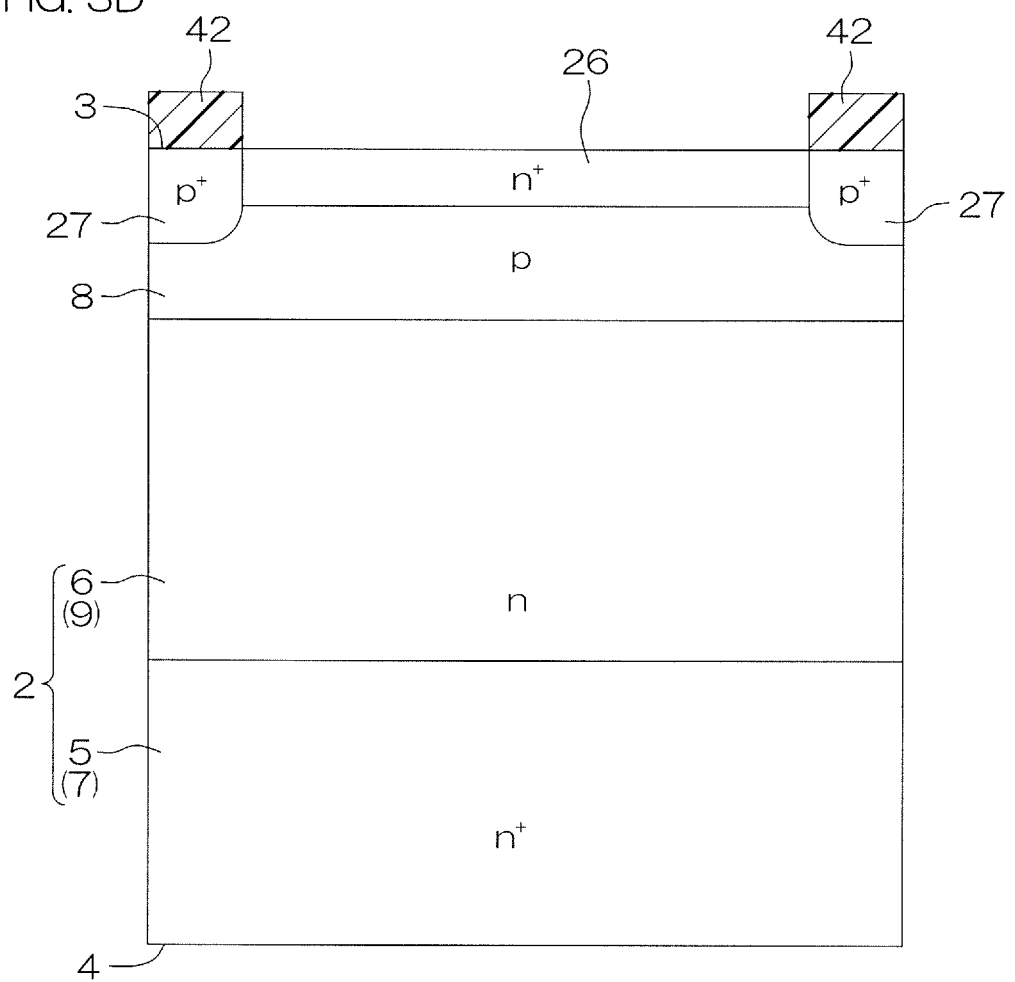
FIG. 3D is a cross-sectional view showing a step subsequent to that of FIG. 3C.

Thereafter, referring to FIG. 3D, the n$^+$ type source region 26 is formed at the surface layer portion of the body region 8 (step S2 of FIG. 2). The step of forming the source region 26 includes a step of introducing an n type impurity into the surface layer portion of the body region 8. The n type impurity may be introduced into the surface layer portion of the body region 8 according to the ion implantation method in which an ion implantation mask 42 is used.

The order in which the body region 8 forming step, the contact region 27 forming step, and the source region 26 forming step are performed is merely an example, and the present invention is not limited to this order. The order in which the body region 8 forming step, the contact region 27 forming step, and the source region 26 forming step are performed may be changed so that these steps are replaced by each other when needed.

Thereafter, referring to FIG. 3E, a hard mask 43 that has a predetermined pattern is formed on the first main surface 3 (step S3 of FIG. 2). The hard mask 43 may include an insulator (for example, silicon oxide). The hard mask 43 has an opening 44 by which a region in which the gate trench 11 is to be formed is exposed.

Figure 3F:
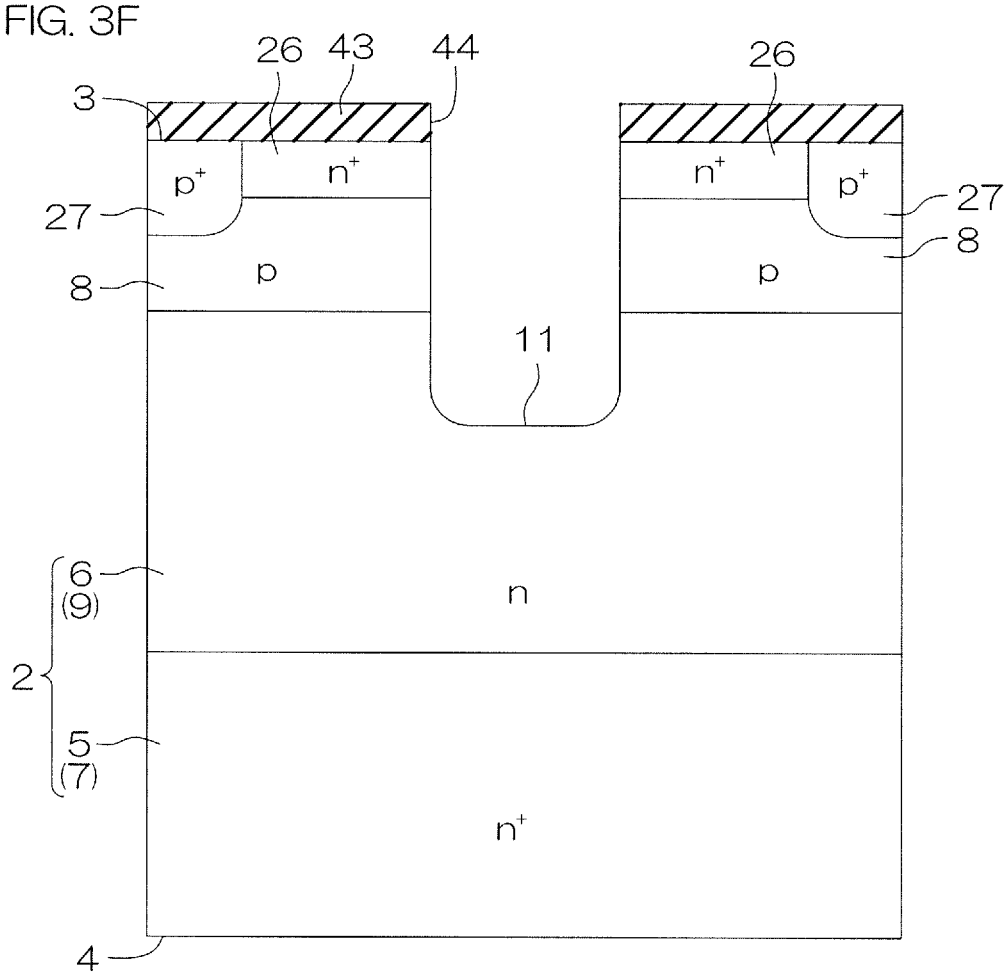
FIG. 3F is a cross-sectional view showing a step subsequent to that of FIG. 3E.

Thereafter, referring to FIG. 3F, a part to serve as the gate trench 11 in the first main surface 3 is removed. A needless part of the SiC semiconductor layer 2 may be removed according to an etching method (for example, dry etching method) in which the hard mask 43 is used. Hence, the gate trench 11 is formed in the first main surface 3. Thereafter, the hard mask 43 is removed.

Thereafter, referring to FIG. 3G, the gate oxide layer 12 is formed at the first main surface 3 (step S4 of FIG. 2). The gate oxide layer 12 is formed according to an oxidation treatment method (more specifically, a thermal oxidation treatment method). In this step, the gate oxide layer 12 that has a thickness of 20 nm or more is formed by oxidizing the first main surface 3 at a temperature of 1000° C. or more.

For example, the gate oxide layer 12 that has a thickness of about 90 nm is formed by oxidizing the first main surface 3 under the conditions of a temperature of 1150° C. and a period of about 20 hours. The gate oxide layer 12 that has a thickness of about 60 nm is formed by oxidizing the first main surface 3 under the conditions of a temperature of 1300° C. and a period of about 40 minutes.

The oxidation treatment method may include a dry oxidation treatment method or a wet oxidation treatment method. The gate oxide layer 12 is formed according to the dry oxidation treatment method in the present preferred embodiment. The gate oxide layer 12 may be formed according to a CVD (Chemical Vapor Deposition) method instead of the oxidation treatment method.

Immediately after the gate oxide layer 12 is formed, dangling bonds and carbon atoms exist in the interfacial region 25 contiguous to the gate oxide layer 12 in the SiC semiconductor layer 2. In FIG. 3G, the dangling bond is represented briefly as "X", and the carbon atom is represented briefly as "C". Both dangling bonds and carbon atoms are one factor of interfacial defects in the interfacial region 25. In a state in which dangling bonds and carbon atoms exist, it is impossible to obtain excellent channel mobility.

Thereafter, referring to FIG. 3H, a nitrogen atom introducing step of introducing nitrogen atoms into the gate oxide layer 12 is performed (step S5 of FIG. 2). The nitrogen atom introducing step is also called a post deposition annealing step or a post oxidation annealing step.

The nitrogen atom introducing step includes a step of applying annealing treatment in a gas atmosphere including nitrogen atoms. Phosphorus atoms are not included in this atmosphere. The nitrogen atom introducing step may be performed under the conditions of a temperature of not less than 1000° C. and not more than 1400° C. (e.g., about 1250° C.) and a period of not less than 1 minute and not more than 600 minutes.

In the present preferred embodiment, the gas that includes nitrogen atoms is a mixed gas in which a NO (nitrogen monoxide) gas that includes nitrogen atoms and oxygen atoms is diluted with an inert gas. The inert gas may include at least one among $N_2$ (nitrogen) gas, Ar (argon) gas, and He (helium) gas. The rate of content of the inert gas in the mixed gas may be not less than 5% and not more than 20% (e.g., about 10%).

In this step, nitrogen atoms in the NO (nitrogen monoxide) gas are introduced into the gate oxide layer 12. These nitrogen atoms are combined with dangling bonds that exist in the interfacial region 25 of the SiC semiconductor layer 2. In FIG. 3H, the nitrogen atom is represented as "N".

Additionally, in this step, oxygen atoms in the NO (nitrogen monoxide) gas are also introduced into the gate oxide layer 12. These oxygen atoms react with carbon atoms in the gate oxide layer 12. Additionally, these oxygen atoms also react with carbon atoms existing in the interfacial region 25 of the SiC semiconductor layer 2. Hence, carbon atoms in the gate oxide layer 12 and carbon atoms existing in the interfacial region 25 of the SiC semiconductor layer 2 become CO (carbon monoxide) or $CO_2$ (carbon dioxide).

In this step, nitrogen atoms make it possible to nitrogen-terminate interfacial defects between the SiC semiconductor layer 2 and the gate oxide layer 12 (i.e., in the interfacial region 25). Additionally, in this step, it is possible to detach carbon atoms from the gate oxide layer 12 and from the interfacial region 25. Therefore, it is possible to reduce interfacial defects between the SiC semiconductor layer 2 and the gate oxide layer 12 (i.e., in the interfacial region 25).

Figure 3I:
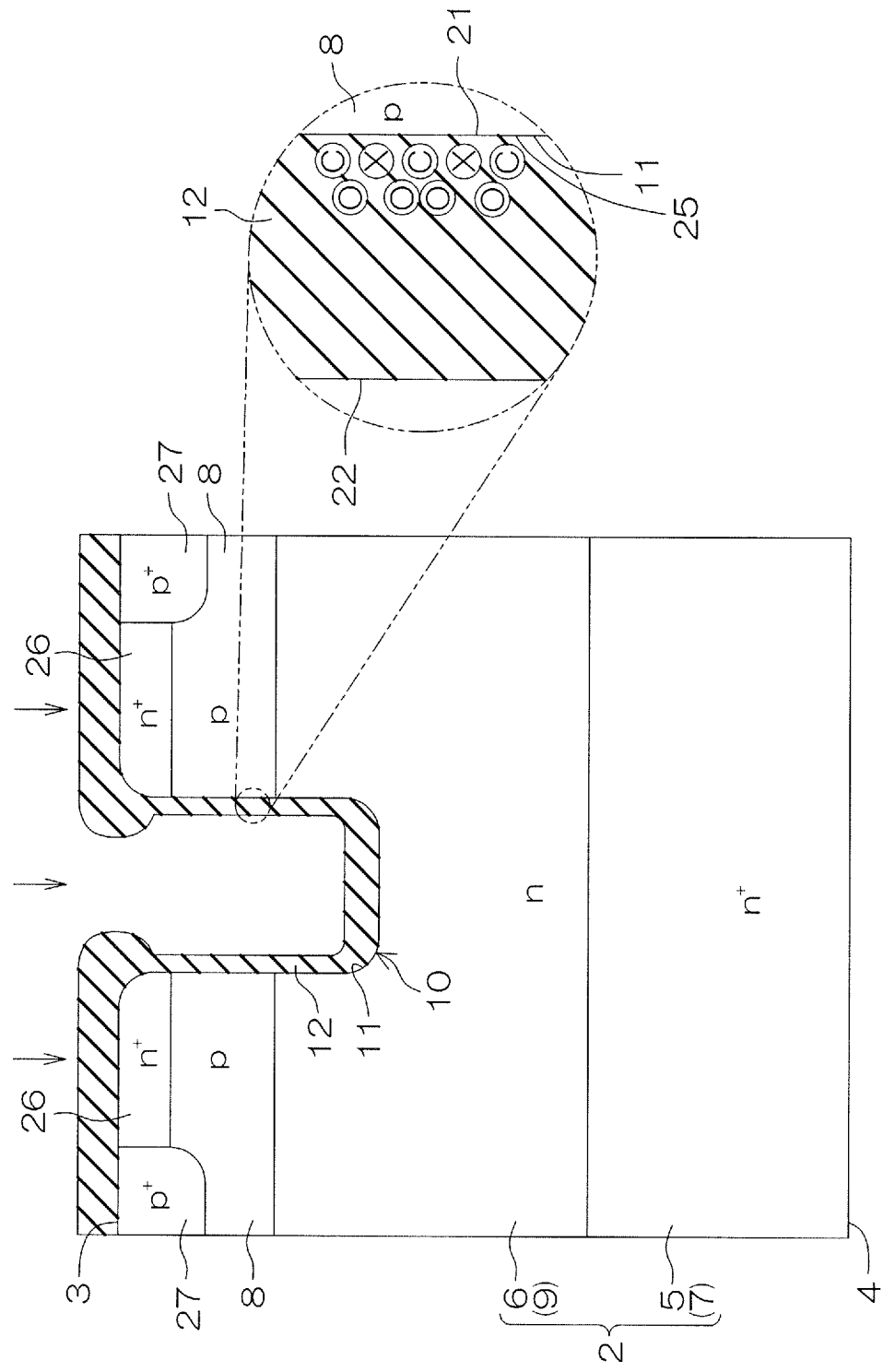
FIG. 3I is a cross-sectional view showing a step subsequent to that of FIG. 3H.

Referring to FIG. 3I, after performing the nitrogen atom introducing step, an oxygen atom introducing step of introducing oxygen atoms into the gate oxide layer 12 is further performed (step S6 of FIG. 2). The oxygen atom introducing step includes a step of applying annealing treatment in a low-oxygen partial pressure atmosphere that has been diluted with a mixed gas including an inert gas. The inert gas may include rare gases, nitrogen atoms, etc. Phosphorus atoms are not included in the low-oxygen partial pressure atmosphere.

The oxygen partial pressure in the low-oxygen partial pressure atmosphere may be not less than 0.1 Pa and not more than 10 Pa. The oxygen atom introducing step may be performed under the conditions of a temperature of not less than 800° C. and not more than 1500° C. (e.g., about 1300° C.) and a period of not less than 1 minute and not more than 600 minutes. The pressure of the mixed gas may be not less than 0.1 atmospheric pressure and not more than 2 atmospheric pressure (e.g., about 1 atmospheric pressure).

In this step, oxygen atoms in an $O_2$ (oxygen) gas are introduced into the gate oxide layer 12. These oxygen atoms react with carbon atoms in the gate oxide layer 12. Additionally, these oxygen atoms also react with carbon atoms existing in the interfacial region 25 of the SiC semiconductor layer 2.

Hence, carbon atoms in the gate oxide layer 12 and carbon atoms existing in the interfacial region 25 become CO (carbon monoxide) or $CO_2$ (carbon dioxide). As a result, it is possible to detach carbon atoms from the gate oxide layer 12 and from the interfacial region 25.

Therefore, it is possible to further reduce interfacial defects between the SiC semiconductor layer 2 and the gate oxide layer 12 (i.e., in the interfacial region 25). Particularly if an atmosphere in which the oxygen partial pressure is not less than 0.1 Pa and not more than 10 Pa is provided, it is possible to appropriately detach carbon atoms from the interfacial region 25 while restraining the interfacial region 25 from being oxidized.

Figure 3J:
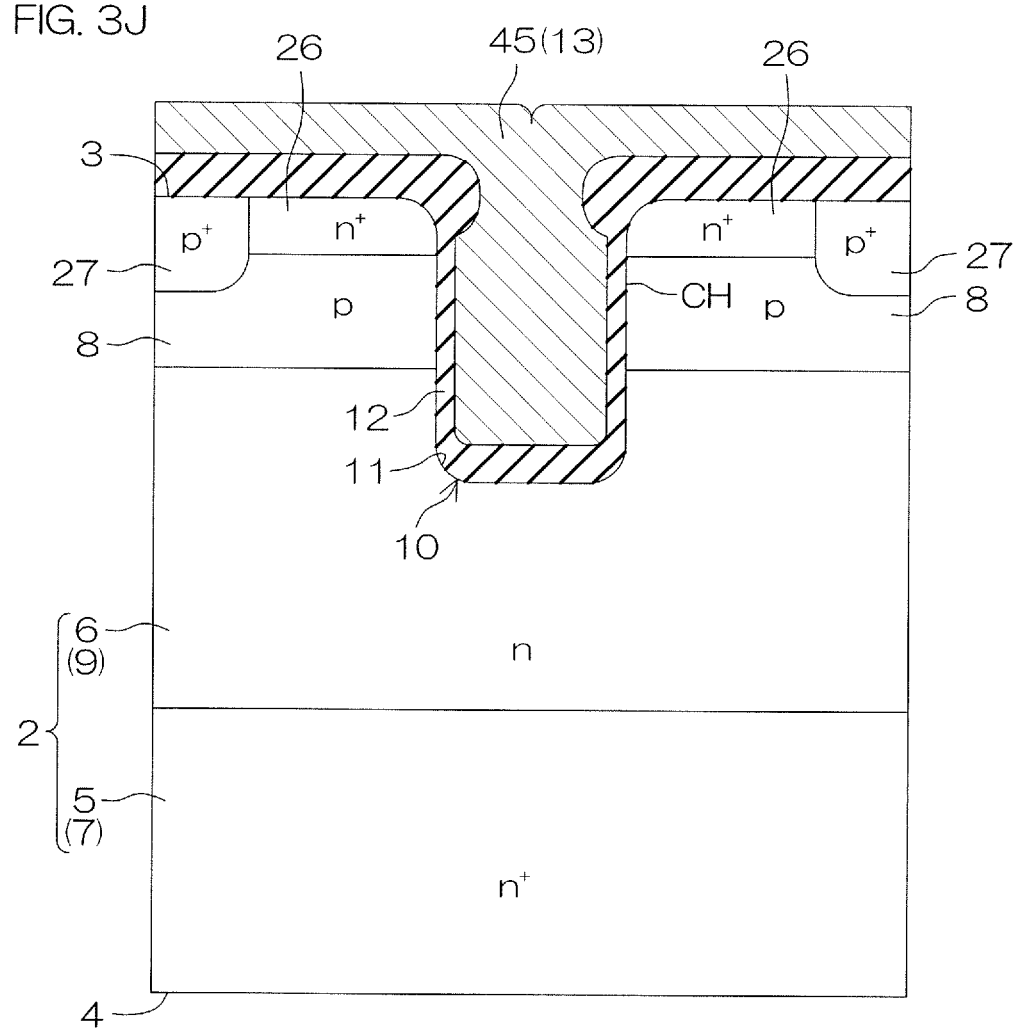
FIG. 3J is a cross-sectional view showing a step subsequent to that of FIG. 3I.

Thereafter, referring to FIG. 3J, a base electrode layer 45 that serves as a base of the gate electrode layer 13 is formed on the first main surface 3 (step S7 of FIG. 2). The base electrode layer 45 may include electroconductive polysilicon. The base electrode layer 45 may be formed according to the CVD method. The base electrode layer 45 fills the gate trench 11, and coats the first main surface 3.

Thereafter, referring to FIG. 3K, a needless part of the base electrode layer 45 is removed. The needless part of the base electrode layer 45 may be removed according to an etching method (for example, wet etching method) in which a mask (not shown) is used. The needless part of the base electrode layer 45 may be removed until the gate oxide layer 12 is exposed. Hence, the gate electrode layer 13 is formed.

Figure 3L:
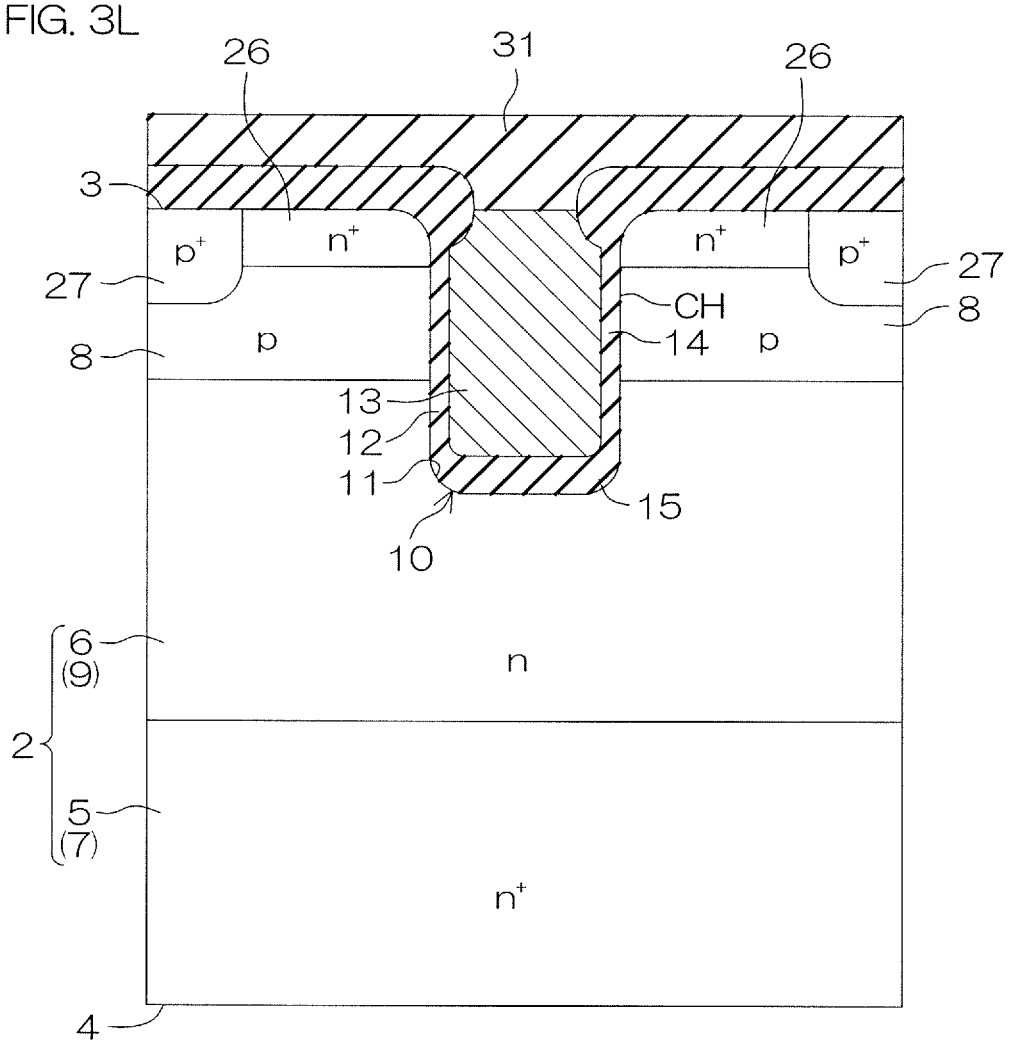
FIG. 3L is a cross-sectional view showing a step subsequent to that of FIG. 3K.
Figure 3N:
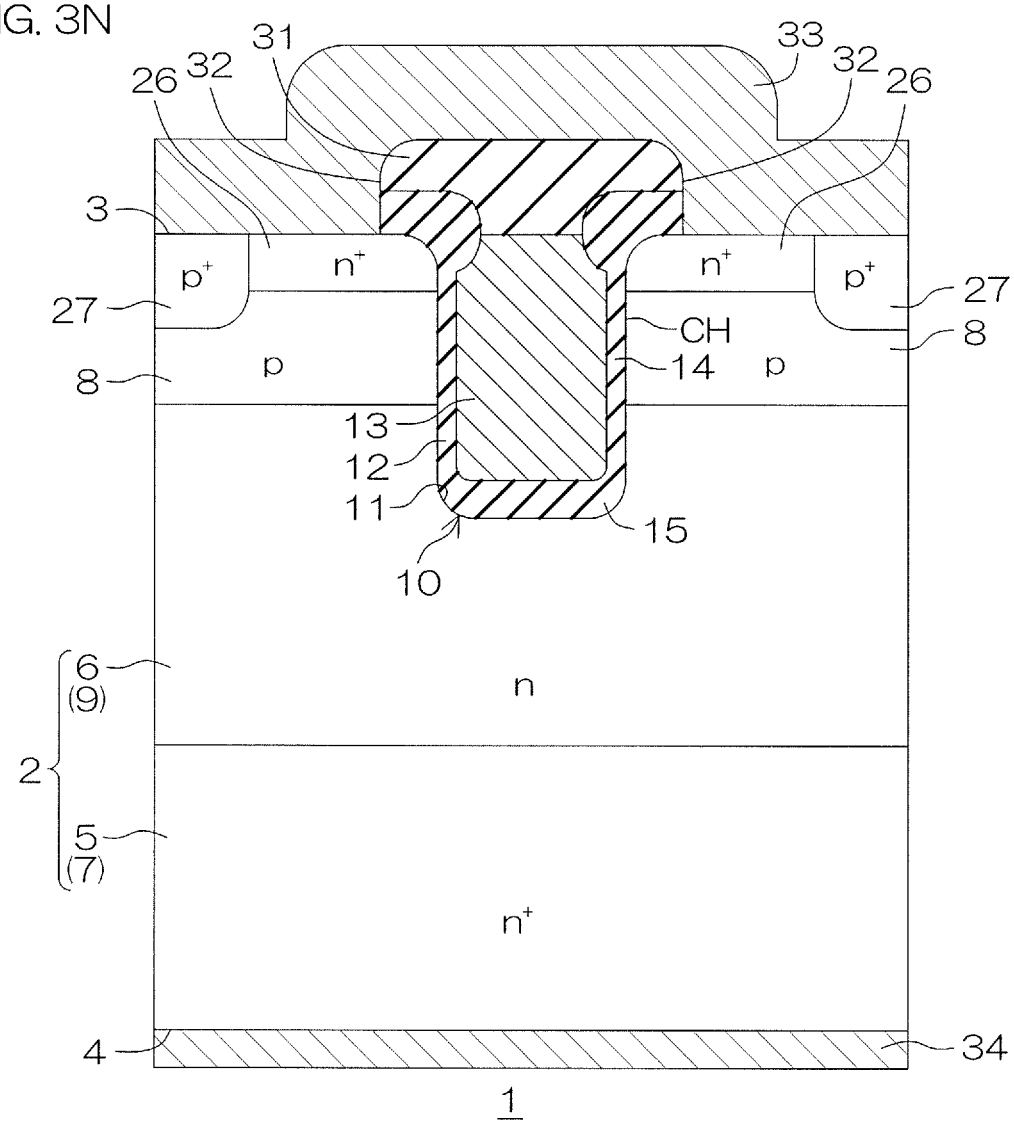
FIG. 3N is a cross-sectional view showing a step subsequent to that of FIG. 3M.

Thereafter, referring to FIG. 3L, the interlayer isolation layer 31 is formed on the first main surface 3 (step S8 of FIG. 2). The interlayer isolation layer 31 may include silicon oxide. The interlayer isolation layer 31 may be formed according to the CVD method.

Thereafter, referring to FIG. 3M, a mask 46 that has a predetermined pattern is formed on the interlayer isolation layer 31 (step S9 of FIG. 2). The mask 46 may be a resist mask including a photosensitive resin. The mask 46 has an opening 47 by which a region in which the contact holes 32 are to be formed is exposed.

Thereafter, a needless part of the interlayer isolation layer 31 is removed. The needless part of the interlayer isolation layer 31 may be removed according to the etching method (for example, wet etching method) in which the mask 46 is used. In this step, a needless part of the gate oxide layer 12 is also removed. Hence, the contact holes 32 are formed. After the contact holes 32 are formed, the mask 46 is removed.

Thereafter, referring to FIG. 3N, the source electrode 33 is formed on the first main surface 3, and the drain electrode 34 is formed on the second main surface 4 (step S10 of FIG. 2). The semiconductor device 1 is manufactured through steps including the aforementioned steps.

Figure 4:
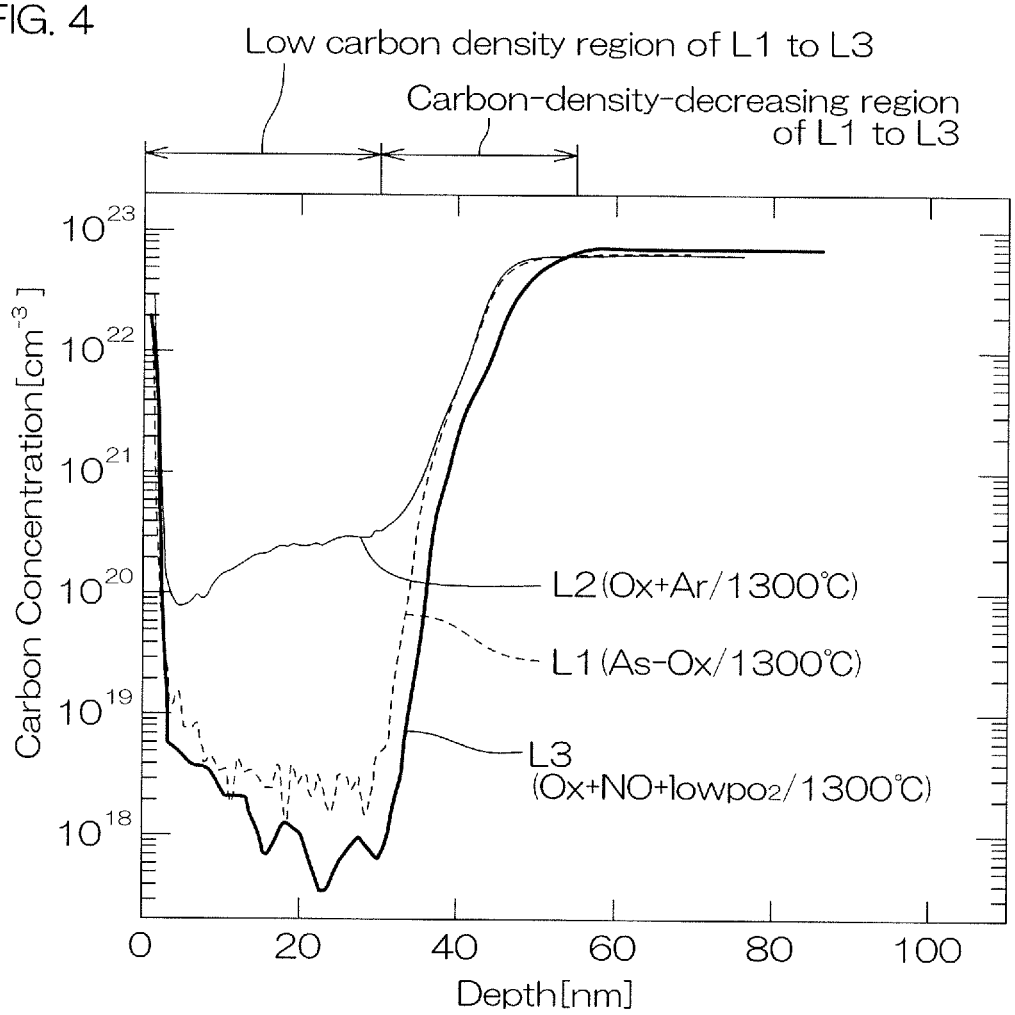
FIG. 4 is a graph showing a measurement result of a carbon density of a gate oxide layer.

FIG. 4 is a graph showing a measurement result of the carbon density of the gate oxide layer manufactured under conditions differing from those of the gate oxide layer 12. In FIG. 4, the ordinate axis represents carbon density [$cm^{-3}$], and the abscissa axis represents depth [nm]. More specifically, the abscissa axis represents depth in a direction facing the SiC semiconductor layer 2 (connection surface 21) from the non-connection surface 22 of the gate oxide layer 12 on the assumption that the non-connection surface 22 of the gate oxide layer 12 is a zero.

A first curve L1, a second curve L2, and a third curve L3 are shown in FIG. 4. The first curve L1 represents the carbon density of a first reference gate oxide layer. In a step of forming the first reference gate oxide layer, the nitrogen atom introducing step (step S5) and the oxygen atom introducing step (step S6) are not performed. The thickness of the first reference gate oxide layer is about 54 nm.

The second curve L2 represents the carbon density of a second reference gate oxide layer. In a step of forming the second reference gate oxide layer, annealing treatment is performed in an Ar (argon) gas atmosphere instead of the nitrogen atom introducing step (step S5) and the oxygen atom introducing step (step S6). The thickness of the second reference gate oxide layer is about 54 nm.

The third curve L3 represents the carbon density of a third reference gate oxide layer. In a step of forming the third reference gate oxide layer, the forming step (step S3) of the gate trench 11 is not performed although the nitrogen atom introducing step (step S5) and the oxygen atom introducing step (step S6) are performed. The thickness of the third reference gate oxide layer is about 54 nm.

The step of forming the third reference gate oxide layer is applied to the step of forming the gate oxide layer 12 according to the present preferred embodiment. The step of forming the gate oxide layer 12 according to the present preferred embodiment differs from the step of forming the third reference gate oxide layer in the fact that the gate oxide layer 12 is formed at the in wall of the gate trench 11 (in a growth direction with respect to the SiC semiconductor layer 2). However, the carbon density of the gate oxide layer 12 according to the present preferred embodiment is substantially equal to the carbon density of the third reference gate oxide layer.

Referring to the first curve L1, the first reference gate oxide layer has the carbon-density-decreasing region 23 and the low carbon density region 24. The carbon-density-decreasing region 23 gradually decreases from the carbon density (not less than $1.0 \times 10^{22}$ $cm^{-3}$) of the SiC semiconductor layer 2 to $1.0 \times 10^{19}$ $cm^{-3}$ or less. The low carbon density region 24 has a carbon density of $1.0 \times 10^{-9}$ $cm^{-3}$ or less.

The carbon density of the first reference gate oxide layer is excellent. However, the nitrogen atom introducing step (step S5) and the oxygen atom introducing step (step S6) are not applied to the first reference gate oxide layer. Therefore, dangling bonds and carbon atoms exist in the interfacial region 25 of the SiC semiconductor layer 2 as shown in FIG. 3G. Therefore, it is impossible to obtain excellent channel mobility.

Referring to the second curve L2, the second reference gate oxide layer has the carbon-density-decreasing region 23 and the low carbon density region 24. The carbon-density-decreasing region 23 gradually decreases from the carbon density (not less than $1.0 \times 10^{22}$ $cm^{-3}$) of the SiC semiconductor layer 2 to $1.0 \times 10^{21}$ $cm^{-3}$ or less. The low carbon density region 24 has a carbon density of not less than $8.0 \times 10^{19}$ $cm^{-3}$ and not more than $1.0 \times 10^{21}$ $cm^{-3}$.

The performance of annealing treatment in an Ar (argon) gas atmosphere is effective to reduce interfacial defects between the SiC semiconductor layer 2 and the gate oxide layer 12 (i.e., in the interfacial region 25). However, as is understood from the second curve L2, the second reference gate oxide layer includes a large number of carbon atoms, and therefore it is impossible to obtain excellent withstand voltage.

Referring to the third curve L3, the third reference gate oxide layer has the carbon-density-decreasing region 23 and the low carbon density region 24. The carbon-density-decreasing region 23 gradually decreases from the carbon density (not less than $1.0 \times 10^{22}$ $cm^{-3}$) of the SiC semiconductor layer 2 to $1.0 \times 10^{=19}$ $cm^{-3}$ or less. The low carbon density region 24 has a carbon density of $1.0 \times 10^{19}$ $cm^{-3}$ or less.

As is also apparent from a comparison between the first curve L1 and the second curve L2, the carbon density of the third reference gate oxide layer is excellent. Additionally, in the step of forming the third reference gate oxide layer, the nitrogen atom introducing step (step S5) is performed, and therefore interfacial defects of the interfacial region 25 is nitrogen-terminated by nitrogen atoms. Additionally, in the step of forming the third reference gate oxide layer, the oxygen atom introducing step (step S6) is performed, and therefore carbon atoms are detached from the interfacial region 25. Therefore, according to the third reference gate oxide layer (i.e., gate oxide layer 12), it is possible to realize excellent channel mobility and excellent withstand voltage.

Additionally, in the manufacturing method according to the third reference gate oxide layer, annealing treatment is not performed in an atmosphere including P (phosphorus). Therefore, P (phosphorus) is not added to the third reference gate oxide layer. In other words, in the third reference gate oxide layer, a charge trap is restrained from being introduced. Therefore, according to the third reference gate oxide layer (i.e., gate oxide layer 12), it is possible to restrain a time-dependent deterioration caused by a charge trap.

Figure 5:
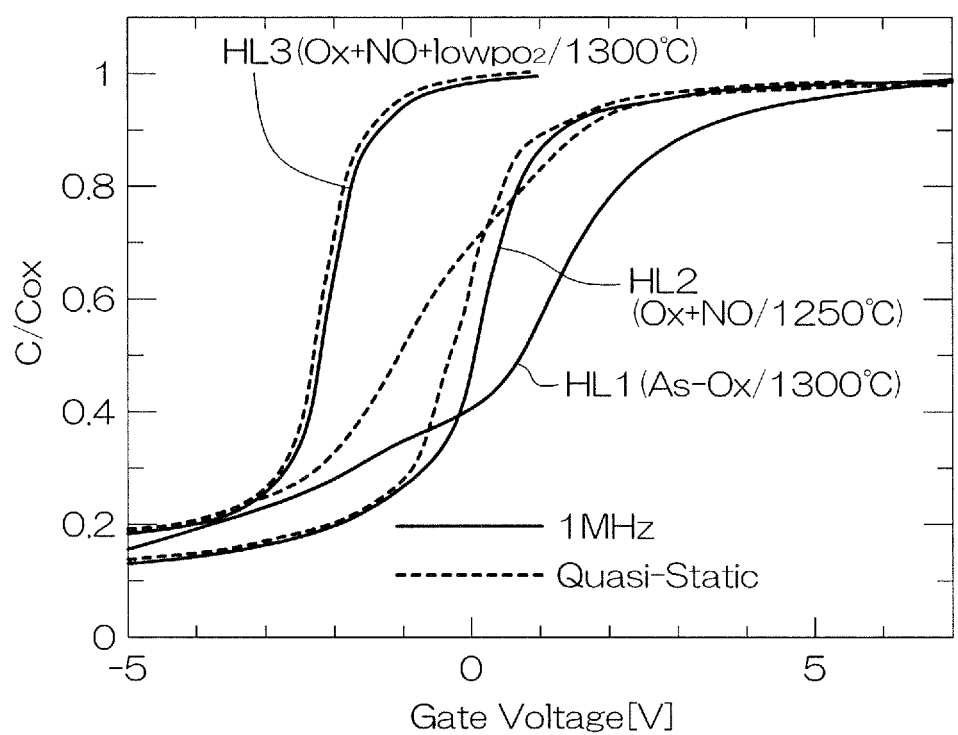
FIG. 5 is a graph showing a measurement result of high-frequency CV characteristics and quasi-static CV characteristics of the gate oxide layer.

FIG. 5 is a graph showing a measurement result of high-frequency CV characteristics and quasi-static CV characteristics. In FIG. 5, the ordinate axis represents a ratio C/Cox of a full capacity C of the semiconductor device 1 to a capacity Cox of the gate oxide layer 12, and the abscissa axis represents gate voltage VG [V].

A first hysteresis curve HL1, a second hysteresis curve HL2, and a third hysteresis curve HL3 are shown in FIG. 5.

The first hysteresis curve HL1 represents high-frequency CV characteristics (see the solid line) and quasi-static CV characteristics (see the broken line) of a fourth reference gate oxide layer. In the step of forming the fourth reference gate oxide layer, the nitrogen atom introducing step (step S5) and the oxygen atom introducing step (step S6) are not performed.

The second hysteresis curve HL2 represents high-frequency CV characteristics (see the solid line) and quasi-static CV characteristics (see the broken line) of a fifth reference gate oxide layer. In the step of forming the fifth reference gate oxide layer, the oxygen atom introducing step (step S6) is not performed although the nitrogen atom introducing step (step S5) is performed.

The third hysteresis curve HL3 represents high-frequency CV characteristics (see the solid line) and quasi-static CV characteristics (see the broken line) of a sixth reference gate oxide layer. In the step of forming the sixth reference gate oxide layer, the forming step (step S3) of the gate trench 11 is not performed although the nitrogen atom introducing step (step S5) and the oxygen atom introducing step (step S6) are performed. The thickness of the sixth reference gate oxide layer is about 54 nm.

The step of forming the sixth reference gate oxide layer is applied to the gate oxide layer 12 according to the present preferred embodiment. The step of forming the gate oxide layer 12 according to the present preferred embodiment differs from the step of forming the sixth reference gate oxide layer in the fact that the gate oxide layer 12 is formed at the inwall of the gate trench 11 (i.e., in a growth direction with respect to the SiC semiconductor layer 2). However, high-frequency CV characteristics and quasi-static CV characteristics of the gate oxide layer 12 according to the present preferred embodiment are substantially equal to high-frequency CV characteristics (see the solid line) and quasi-static CV characteristics (see broken line) of the sixth reference gate oxide layer.

The interface state density Dit becomes larger in proportion to an increase in the capacity difference between high-frequency CV characteristics (see the solid line) and quasi-static CV characteristics (see the broken line). In other words, the capacity difference between high-frequency CV characteristics (see the solid line) and quasi-static CV characteristics (see the broken line) denotes the quantity of electric charge captured by the gate oxide layer.

Referring to FIG. 5, it is understood that the capacity difference between high-frequency CV characteristics (see the solid line) and quasi-static CV characteristics (see the broken line) becomes smaller in the order of the first hysteresis curve HL, the second hysteresis curve HL2, and the third hysteresis curve HL3.

The effective fixed charge of the fourth reference gate oxide layer was about $-7.0 \times 10^{11}$ cm$^{-2}$. The effective fixed charge is calculated by multiplying a flat band voltage shift by a capacity value of the gate oxide layer. The effective fixed charge of the fifth reference gate oxide layer was about $-1.0 \times 10$ cm$^{-2}$.

The effective fixed charge of the sixth reference gate oxide layer has a positive value. The effective fixed charge of the sixth reference gate oxide layer was not less than $1.0 \times 10^{11}$ cm$^{-2}$ and not more than $1.0 \times 10^{13}$ cm$^{-2}$ (more specifically, about $1.0 \times 10^{12}$ cm$^{-2}$).

Figure 6:
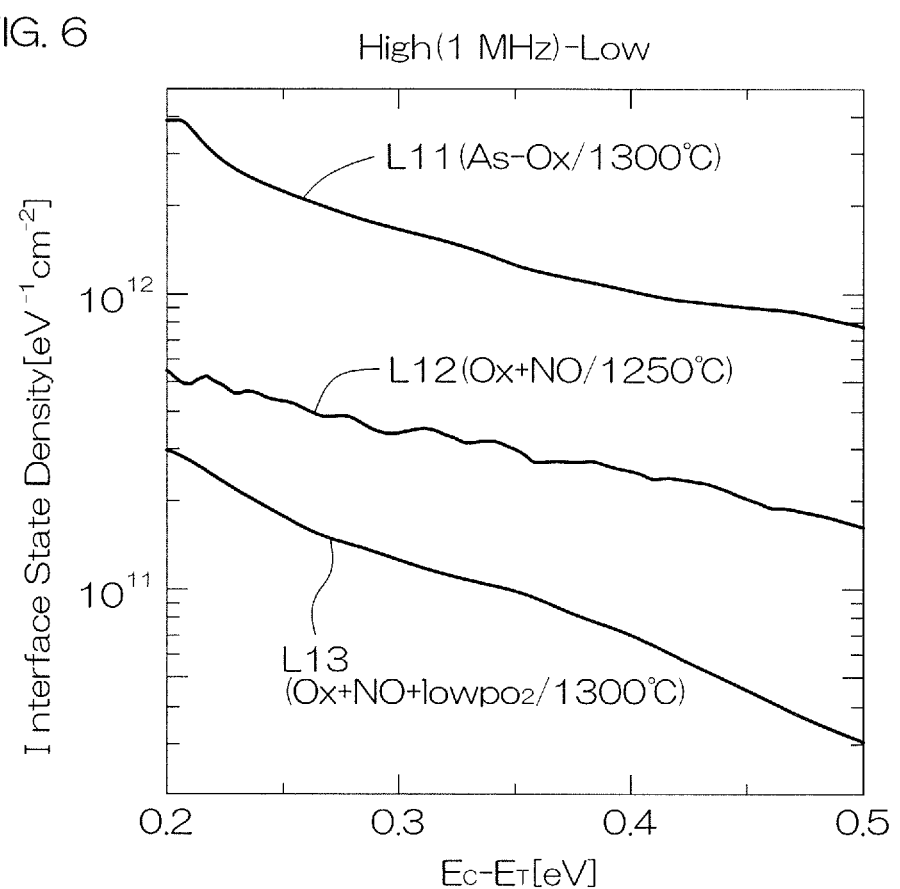
FIG. 6 is a graph obtained by converting the graph of FIG. 5 into an interface state density on the basis of a high-low method.

FIG. 6 is a graph obtained by converting the graph of FIG. 5 into interface state density Dit on the basis of a high-low method. In FIG. 6, the ordinate axis represents interface state density Dit [eV$^{-1}$·cm$^{-2}$], and the abscissa axis represents an energy level EC-ET [eV$^{-1}$] from a conduction band edge. More specifically, an energy level EC-ET from a conduction band edge is a difference between the energy level EC of a conduction band and the energy level ET of a trap band.

A first curve L11, a second curve L12, and a third curve L13 are shown in FIG. 6.

The first curve L11 represents characteristics of the interface state density Dit of the interfacial region 25 contiguous to the fourth reference gate oxide layer in the SiC semiconductor layer 2. The second curve L12 represents characteristics of the interface state density Dit of the interfacial region 25 contiguous to the fifth reference gate oxide layer in the SiC semiconductor layer 2.

The third curve L13 represents characteristics of the interface state density Dit of the interfacial region 25 contiguous to the sixth reference gate oxide layer in the SiC semiconductor layer 2. The step of forming the gate oxide layer 12 according to the present preferred embodiment differs from the step of forming the sixth reference gate oxide layer in the fact that the gate oxide layer 12 is formed at the inwall of the gate trench 11 (i.e., in a growth direction with respect to the SiC semiconductor layer 2). However, the interface state density Dit of the gate oxide layer 12 according to the present preferred embodiment is substantially equal to the interface state density Dit of the sixth reference gate oxide layer.

Referring to FIG. 6, it is understood that the interface state density Dit becomes smaller in the order of the first curve L11, the second curve L12, and the third curve L13. Referring to the third curve L13, the interface state density Dit according to the sixth reference gate oxide layer was $4.0 \times 10^{11}$ eV$^{-1}$·cm$^{-2}$ or less when the energy level EC-ET from the conduction band edge was within the range of not less than 0.2 eV and not more than 0.5 eV.

Additionally, the interface state density Dit according to the sixth reference gate oxide layer was $2.0 \times 10^{11}$ eV$^{-1}$·cm$^{-2}$ or less when the energy level EC-ET from the conduction band edge was within the range of not less than 0.3 eV and not more than 0.5 eV. Additionally, the interface state density Dit according to the sixth reference gate oxide layer was $1.0 \times 10^{11}$ eV$^{-1}$·cm$^{-2}$ or less when the energy level EC-ET from the conduction band edge was within the range of not less than 0.4 eV and not more than 0.5 eV.

The interface state density Dit and the channel mobility of the SiC semiconductor layer 2 are in a mutually contradictory relationship. In other words, if the interface state density Dit is high, the channel mobility of the SiC semiconductor layer 2 becomes low. On the other hand, if the interface state density Dit is low, the channel mobility of the SiC semiconductor layer 2 becomes high.

The interface state density Dit according to the sixth reference gate oxide layer is $4.0 \times 10^{11}$ eV$^{-1}$·cm$^{-2}$ or less, which is comparatively low. In a semiconductor device having the sixth reference gate oxide layer (i.e., in the semiconductor device 1 having the gate oxide layer 12), the channel mobility of the SiC semiconductor layer 2 is 50 cm$^2$/Vs or more.

Figure 7:
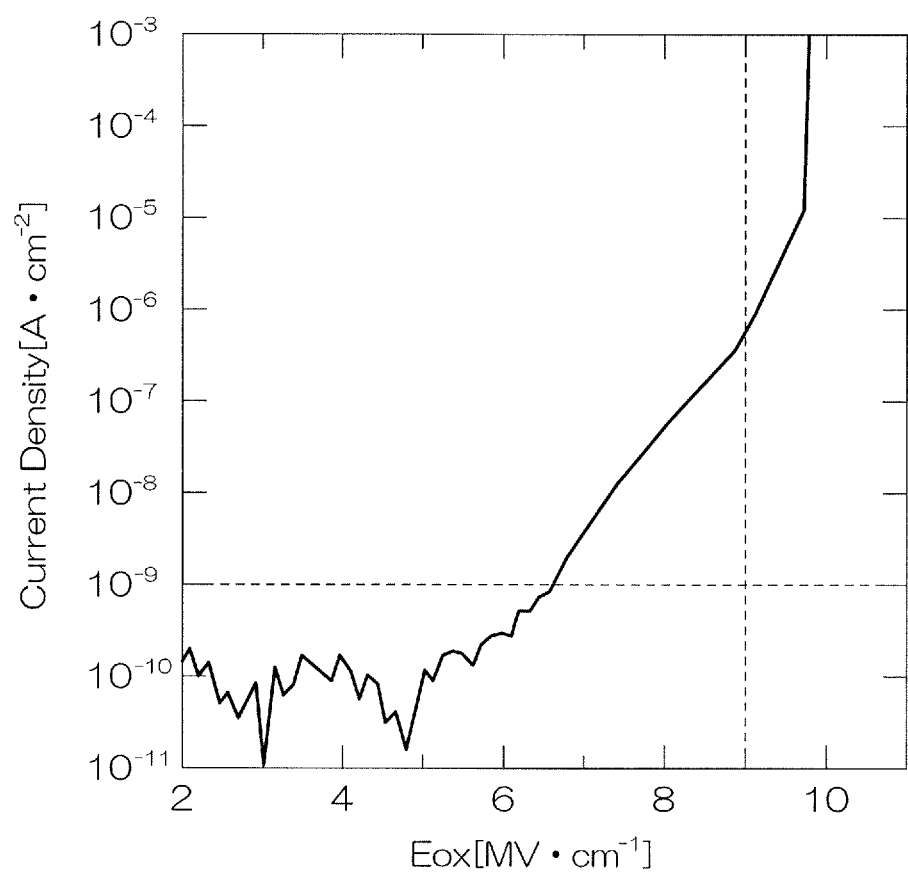
FIG. 7 is a graph showing a measurement result of current density characteristics of the gate oxide layer.

FIG. 7 is a graph showing a measurement result of current density characteristics of the gate oxide layer 12. In FIG. 7, the ordinate axis represents electric current density [A·cm$^{-2}$] flowing through the gate oxide layer 12, and the abscissa axis represents electric field strength [MV·cm$^{-1}$] applied to the gate oxide layer 12.

When the electric field strength applied to the gate oxide layer 12 was 6.0 MV·cm$^{-1}$ or less, the electric current density flowing through the gate oxide layer 12 was $1.0 \times 10^{-9}$ A·cm$^{-2}$ or less. When the electric field strength applied to the gate oxide layer 12 rose to 9.0 MV·cm$^{-1}$ from 6.0 MV·cm$^{-1}$, the electric current density flowing through the gate oxide layer 12 rose to about $1.0 \times 10^{-6}$ A·cm$^{-2}$.

The electric current density flowing through the gate oxide layer 12 greatly increased when the electric field strength applied to the gate oxide layer 12 became 9.0 MV·cm$^{-1}$ (more specifically, 9.5 MV·cm$^{-1}$) or more. From this, it has been understood that the gate oxide layer 12 has a comparatively high breakdown electric field strength, i.e., has 9.0 MV·cm$^{-1}$ (more specifically, 9.5 MV·cm$^{-1}$) or more.

As described above, according to the method for manufacturing the semiconductor device 1, nitrogen atoms are introduced into the gate oxide layer 12 in the nitrogen atom introducing step (step S5 of FIG. 2). These nitrogen atoms reach the interfacial region 25 contiguous to the gate oxide layer 12 in the SiC semiconductor layer 2 (also see FIG. 3H). Hence, it is possible to nitrogen-terminate interfacial defects between the SiC semiconductor layer 2 and the gate oxide layer 12 (i.e., in the interfacial region 25) by means of nitrogen atoms.

Additionally, according to this manufacturing method, annealing treatment is applied to the gate oxide layer 12 in an atmosphere including oxygen atoms in the oxygen atom introducing step (step S6 of FIG. 2). Hence, oxygen atoms are introduced into the gate oxide layer 12 (also see FIG. 3I).

These oxygen atoms react with carbon atoms in the gate oxide layer 12. These oxygen atoms also react with carbon atoms existing in the interfacial region 25. Hence, the carbon atoms in the gate oxide layer 12 and the carbon atoms existing in the interfacial region 25 become CO (carbon monoxide) or $CO_2$ (carbon dioxide).

As a result, it is possible to detach the carbon atoms from the gate oxide layer 12 and from the interfacial region 25. Therefore, it is possible to reduce interfacial defects between the SiC semiconductor layer 2 and the gate oxide layer 12, and it is possible to obtain the gate oxide layer 12 having a good quality.

Preferably, the gate oxide layer 12 has a comparatively small thickness. Preferably, the thickness of the gate oxide layer 12 is, more specifically, not less than 20 nm and not more than 150 nm. More preferably, the thickness of the gate oxide layer 12 is not less than 20 nm and not more than 100 nm. It is possible to appropriately detach carbon atoms in the gate oxide layer 12 by reducing the thickness of the gate oxide layer 12. This makes it possible to appropriately reduce the carbon density in the interfacial region 25, and makes it possible to appropriately reduce interfacial defects therein.

FIG. 8 is a cross-sectional view showing a region in which a planar type MISFET is formed in a semiconductor device 51 according to a second preferred embodiment of the present invention. In the following second preferred embodiment, the same reference sign is given to a component structure equivalent to each component structure of the semiconductor device 1, and a description of the component structure is omitted.

Referring to FIG. 8, the semiconductor device 51 has a basic form including a planar-gate type MISFET. The semiconductor device 51 includes an n type SiC semiconductor layer 2. A p type well body region 8 is formed at a surface layer portion of a first main surface 3 of the SiC semiconductor layer 2. A source region 26 and a contact region 27 are formed at a surface layer portion of the body region 8.

The source region 26 is formed with an interval inwardly from a peripheral edge of the body region 8. The contact region 27 is formed at a central portion of the body region 8 in a plan view. The source region 26 may surround the contact region 27.

A planar gate structure 62 is formed at the first main surface 3 of the SiC semiconductor layer 2. The planar gate structure 62 has a layered structure that includes a gate oxide layer 12 and a gate electrode layer 13 that are stacked together in this order on the first main surface 3.

The gate oxide layer 12 faces the source region 26, the body region 8, and the drift region 9 on the first main surface 3. The gate oxide layer 12 may have a thickness of not less than 20 nm and not more than 500 nm. The thickness of the gate oxide layer 12 is the thickness along a normal direction of the first main surface 3 in the present preferred embodiment. Preferably, the thickness of the gate oxide layer 12 is 150 nm or less. More preferably, the thickness of the gate oxide layer 12 is 100 nm or less. The gate oxide layer 12 is formed with a uniform thickness in the present preferred embodiment.

The gate oxide layer 12 has a connection surface 21 contiguous to the first main surface 3 and a non-connection surface 22 positioned on the side opposite to the connection surface 21. The gate oxide layer 12 includes the aforementioned carbon-density-decreasing region 23 and the aforementioned low carbon density region 24. The carbon density profile of the gate oxide layer 12 is the same as the carbon density profile of the third reference gate oxide layer (i.e., gate oxide layer 12) as shown in FIG. 4.

The gate electrode layer 13 faces the source region 26, the body region 8, and the drift region 9 with the gate oxide layer 12 between the gate electrode layer 13 and these regions. The gate electrode layer 13 may include at least one among copper, aluminum, and electroconductive polysilicon.

A channel CH of the MISFET is formed in a region facing the gate electrode layer 13 with the gate oxide layer 12 therebetween in the body region 8. An interfacial region 25 is formed at an interface contiguous to the gate oxide layer 12 in the SiC semiconductor layer 2.

An interlayer isolation layer 31 is formed on the first main surface 3. The interlayer isolation layer 31 coats the planar gate structure 62. Contact holes 32 by which the source region 26 and the contact region 27 are exposed are formed in the interlayer isolation layer 31.

A source electrode 33 is formed on the interlayer isolation layer 31. The source electrode 33 enters the contact holes 32 from on the interlayer isolation layer 31. The source electrode 33 is connected to the source region 26 and to the contact region 27 in the contact holes 32. A drain electrode 34 is connected onto the second main surface 4 of the SiC semiconductor layer 2.

FIG. 9 is a flowchart to describe an example of a method for manufacturing the semiconductor device 51 shown in FIG. 8. FIG. 10A to FIG. 10L are cross-sectional views to describe an example of a method for manufacturing the semiconductor device 51 shown in FIG. 8.

Figure 10A:
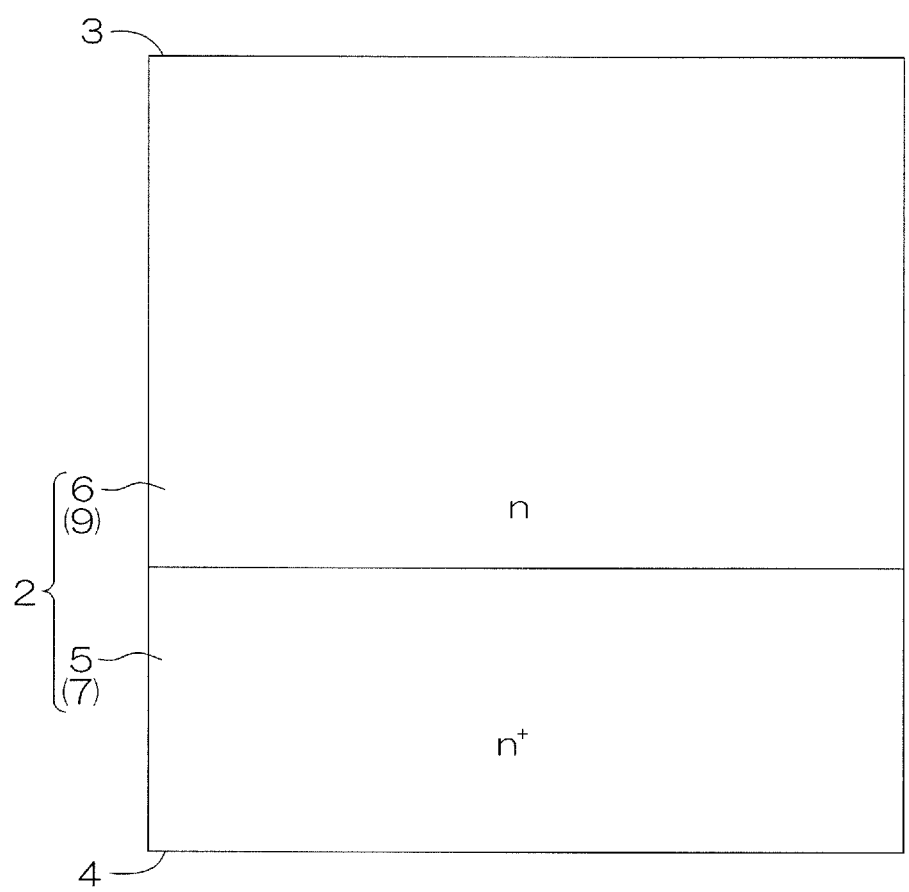
FIG. 10A is a cross-sectional view to describe an example of a method for manufacturing the semiconductor device shown in FIG. 8.

Referring to FIG. 10A, the SiC semiconductor layer 2 is prepared (step S11 of FIG. 9). The SiC semiconductor layer 2 is formed through a step of preparing the SiC semiconductor substrate 5 and through a step of forming the SiC epitaxial layer 6 on a main surface of the SiC semiconductor substrate 5. The SiC epitaxial layer 6 is formed by epitaxially growing SiC from the main surface of the SiC semiconductor substrate 5.

Thereafter, referring to FIG. 10B, the p type body region 8 is formed at the surface layer portion of the first main surface 3 (step S12 of FIG. 9). The step of forming the body region 8 includes a step of introducing a p type impurity into the surface layer portion of the first main surface 3. The p type impurity may be introduced into the surface layer portion of the first main surface 3 of the SiC semiconductor layer 2 according to an ion implantation method in which an ion implantation mask 71 is used.

Thereafter, referring to FIG. 10C, the $n^+$ type source region 26 is formed at the surface layer portion of the body region 8 (step S12 of FIG. 9). The step of forming the source region 26 includes a step of introduces an n type impurity into the surface layer portion of the body region 8. The n type impurity may be introduced into the surface layer portion of the body region 8 according to the ion implantation method in which an ion implantation mask 72 is used.

Thereafter, referring to FIG. 10D, the $p^+$ type contact region 27 is formed at the surface layer portion of the body region 8 (step S12 of FIG. 9). The step of forming the contact region 27 includes a step of introducing a p type impurity into the surface layer portion of the body region 8. The p type impurity may be introduced into the surface layer portion of the body region 8 according to the ion implantation method in which an ion implantation mask 73 is used.

The order in which the body region 8 forming step, the source region 26 forming step, and the contact region 27 forming step are performed is merely an example, and the present invention is not limited to this order. The order in which the body region 8 forming step, the source region 26 forming step, and the contact region 27 forming step are performed may be changed so that these steps are replaced by each other when needed.

Figure 10E:
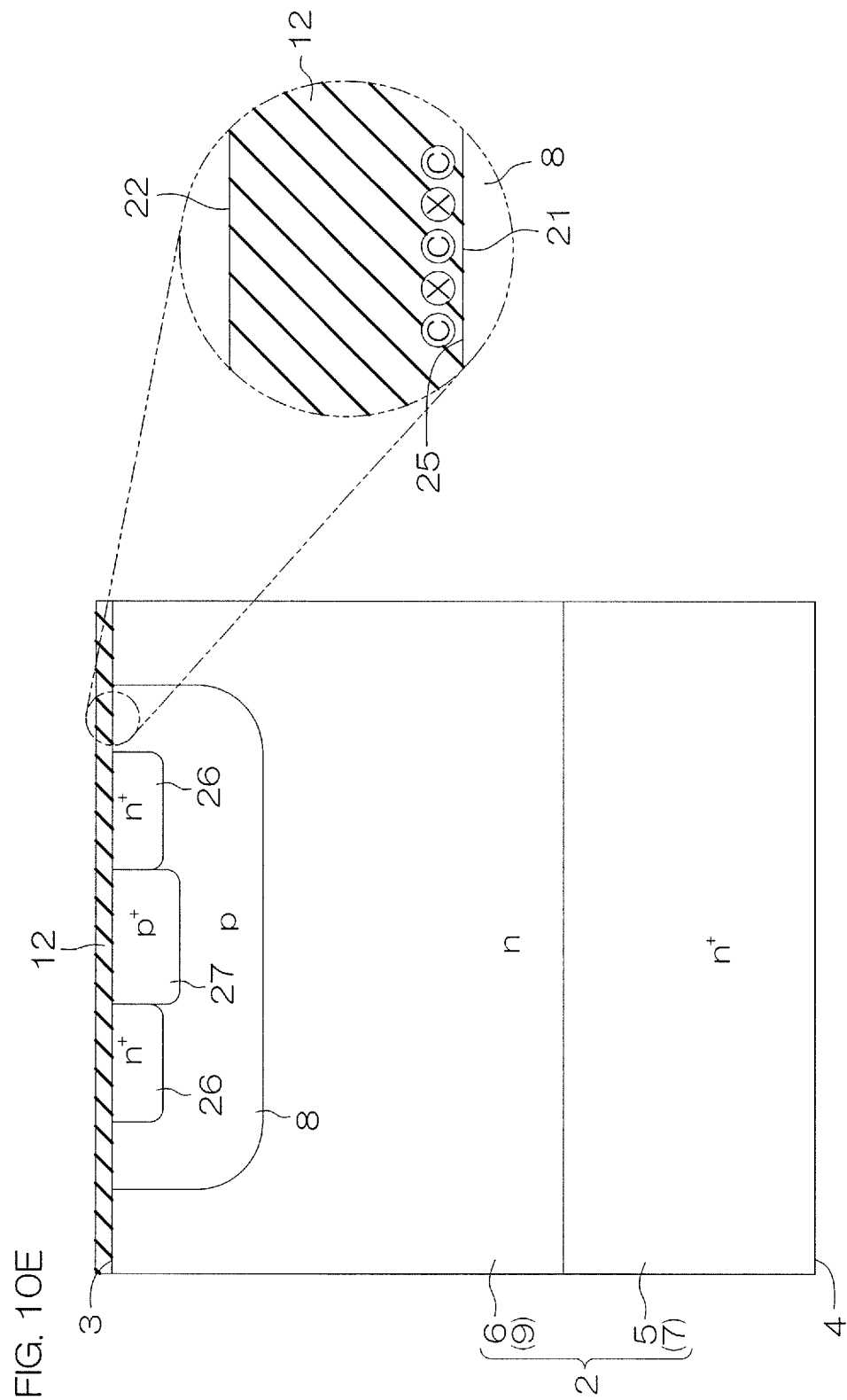
FIG. 10E is a cross-sectional view showing a step subsequent to that of FIG. 10D.

Thereafter, referring to FIG. 10E, the gate oxide layer 12 is formed at the first main surface 3 (step S13 of FIG. 9). The gate oxide layer 12 is formed according to an oxidation treatment method (more specifically, a thermal oxidation treatment method). In this step, the gate oxide layer 12 that has a thickness of 20 nm or more is formed by oxidizing the first main surface 3 at a temperature of 1000° C. or more.

For example, the gate oxide layer 12 that has a thickness of about 90 nm is formed by oxidizing the first main surface 3 under the conditions of a temperature of 1150° C. and a period of about 20 hours. Additionally, the gate oxide layer 12 that has a thickness of about 60 nm is formed by oxidizing the first main surface 3 under the conditions of a temperature of 1300° C. and a period of about 40 minutes.

The oxidation treatment method may include a dry oxidation treatment method or a wet oxidation treatment method. The gate oxide layer 12 is formed according to the dry oxidation treatment method in the present preferred embodiment. Of course, the gate oxide layer 12 may be formed according to a CVD (Chemical Vapor Deposition) method instead of the oxidation treatment method.

Immediately after the gate oxide layer 12 is formed, dangling bonds and carbon atoms exist in the interfacial region 25 contiguous to the gate oxide layer 12 in the SiC semiconductor layer 2. In FIG. 10E, the dangling bond is represented briefly as "X," and the carbon atom is represented briefly as "C." Both dangling bonds and carbon atoms are one factor of interfacial defects in the interfacial region 25. In a state in which dangling bonds and carbon atoms exist, it is impossible to obtain excellent channel mobility.

Figure 10F:
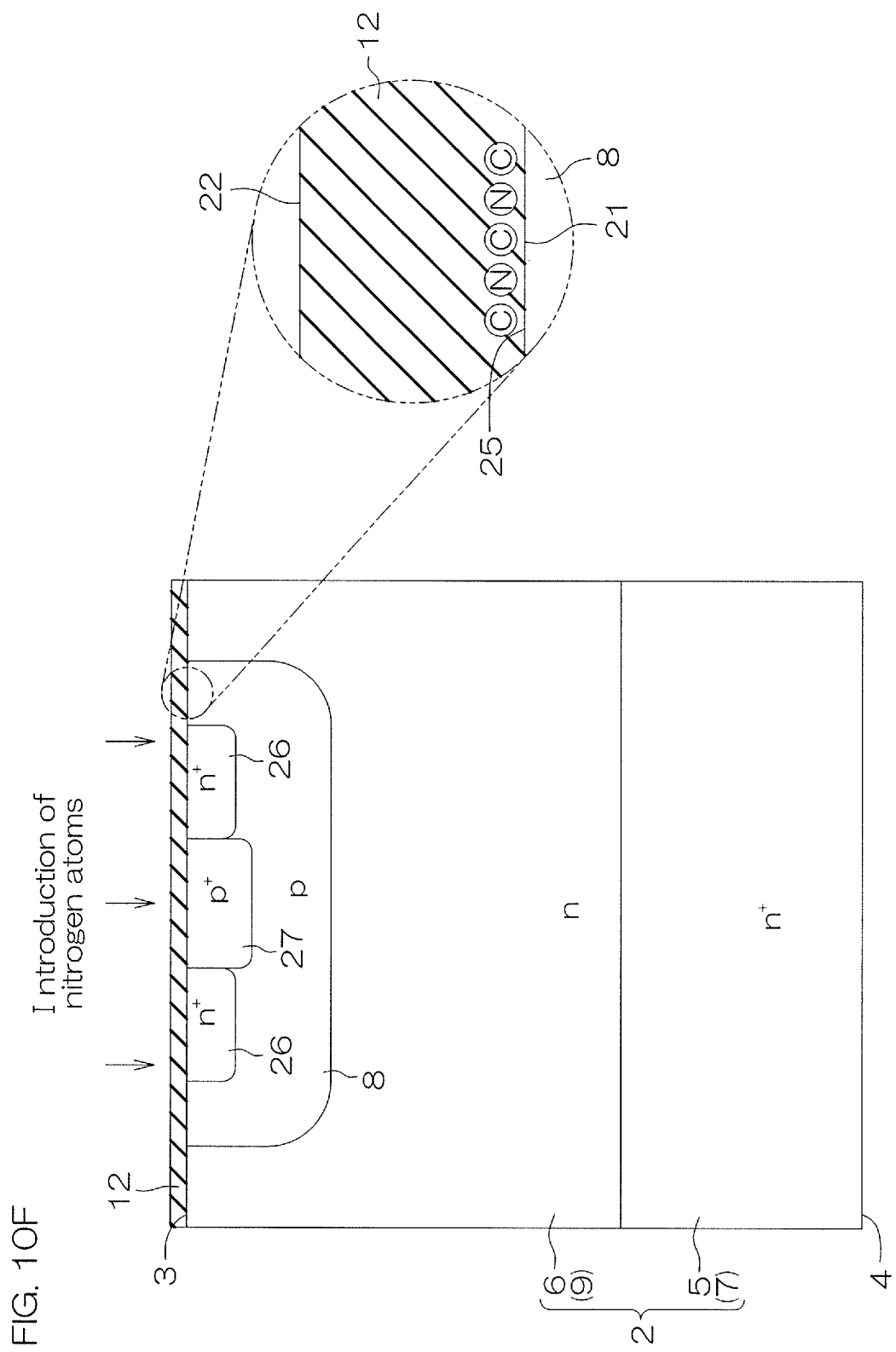
FIG. 10F is a cross-sectional view showing a step subsequent to that of FIG. 10E.

Thereafter, referring to FIG. 10F, a nitrogen atom introducing step of introducing nitrogen atoms into the gate oxide layer 12 is performed (step S14 of FIG. 9). The nitrogen atom introducing step is also called a post deposition annealing step or a post oxidation annealing step.

The nitrogen atom introducing step may be performed under the conditions of a temperature of not less than 1000° C. and not more than 1400° C. (e.g., about 1250° C.) and a period of not less than 1 minute and not more than 600 minutes. The nitrogen atom introducing step includes a step of applying annealing treatment in a gas atmosphere including nitrogen atoms. Phosphorus atoms are not included in this atmosphere.

In the present preferred embodiment, the gas that includes nitrogen atoms is a mixed gas in which a NO (nitrogen monoxide) gas that includes nitrogen atoms and oxygen atoms is diluted with an inert gas. The inert gas may include at least one among $N_2$ (nitrogen) gas, Ar (argon) gas, and He (helium) gas. The rate of content of the inert gas in the mixed gas may be not less than 5% and not more than 20% (e.g., about 10%).

In this step, nitrogen atoms in the NO (nitrogen monoxide) gas are introduced into the gate oxide layer 12. These nitrogen atoms are combined with dangling bonds that exist in the interfacial region 25 of the SiC semiconductor layer 2. In FIG. 10F, the nitrogen atom is represented as "N."

Additionally, in this step, oxygen atoms in the NO (nitrogen monoxide) gas are also introduced into the gate oxide layer 12. These oxygen atoms react with carbon atoms in the gate oxide layer 12. Additionally, these oxygen atoms also react with carbon atoms existing in the interfacial region 25. Hence, carbon atoms in the gate oxide layer 12 and carbon atoms existing in the interfacial region 25 become CO (carbon monoxide) or $CO_2$ (carbon dioxide).

As thus described, in this step, nitrogen atoms make it possible to nitrogen-terminate interfacial defects between the SiC semiconductor layer 2 and the gate oxide layer 12 (i.e., in the interfacial region 25). Additionally, in this step, it is possible to detach carbon atoms from the gate oxide layer 12 and from the interfacial region 25. Therefore, it is possible to reduce interfacial defects between the SiC semiconductor layer 2 and the gate oxide layer 12 (i.e., in the interfacial region 25).

Referring to FIG. 10G, after performing the nitrogen atom introducing step, an oxygen atom introducing step of introducing oxygen atoms into the gate oxide layer 12 is further performed (step S15 of FIG. 9). The oxygen atom introducing step includes a step of applying annealing treatment in a low-oxygen partial pressure atmosphere that has been diluted with a mixed gas including an inert gas. The inert gas may include rare gases, nitrogen atoms, etc. Phosphorus atoms are not included in this atmosphere.

The oxygen partial pressure in the low-oxygen partial pressure atmosphere may be not less than 0.1 Pa and not more than 10 Pa. The oxygen atom introducing step may be performed under the conditions of a temperature of not less than 800° C. and not more than 1500° C. (e.g., about 1300° C.) and a period of not less than 1 minute and not more than 600 minutes. The pressure of the mixed gas may be not less than 0.1 atmospheric pressure and not more than 2 atmospheric pressure (e.g., about 1 atmospheric pressure).

In this step, oxygen atoms in an $O_2$ (oxygen) gas are introduced into the gate oxide layer 12. These oxygen atoms react with carbon atoms in the gate oxide layer 12. Additionally, these oxygen atoms also react with carbon atoms existing in the interfacial region 25.

Hence, carbon atoms in the gate oxide layer 12 and carbon atoms existing in the interfacial region 25 become CO (carbon monoxide) or $CO_2$ (carbon dioxide). As a result, it is possible to detach carbon atoms from the gate oxide layer 12 and from the interfacial region 25.

Therefore, it is possible to further reduce interfacial defects between the SiC semiconductor layer 2 and the gate oxide layer 12 (i.e., in the interfacial region 25). Particularly if an atmosphere in which the oxygen partial pressure is not less than 0.1 Pa and not more than 10 Pa is provided, it is possible to appropriately detach carbon atoms from the interfacial region 25 while restraining the interfacial region 25 from being oxidized.

Thereafter, referring to FIG. 10H, a base electrode layer 74 that serves as a base of the gate electrode layer 13 is formed on the first main surface 3 (step S16 of FIG. 9). The base electrode layer 74 may include polysilicon or aluminum. The base electrode layer 74 may be formed according to the CVD method.

Figure 10I:
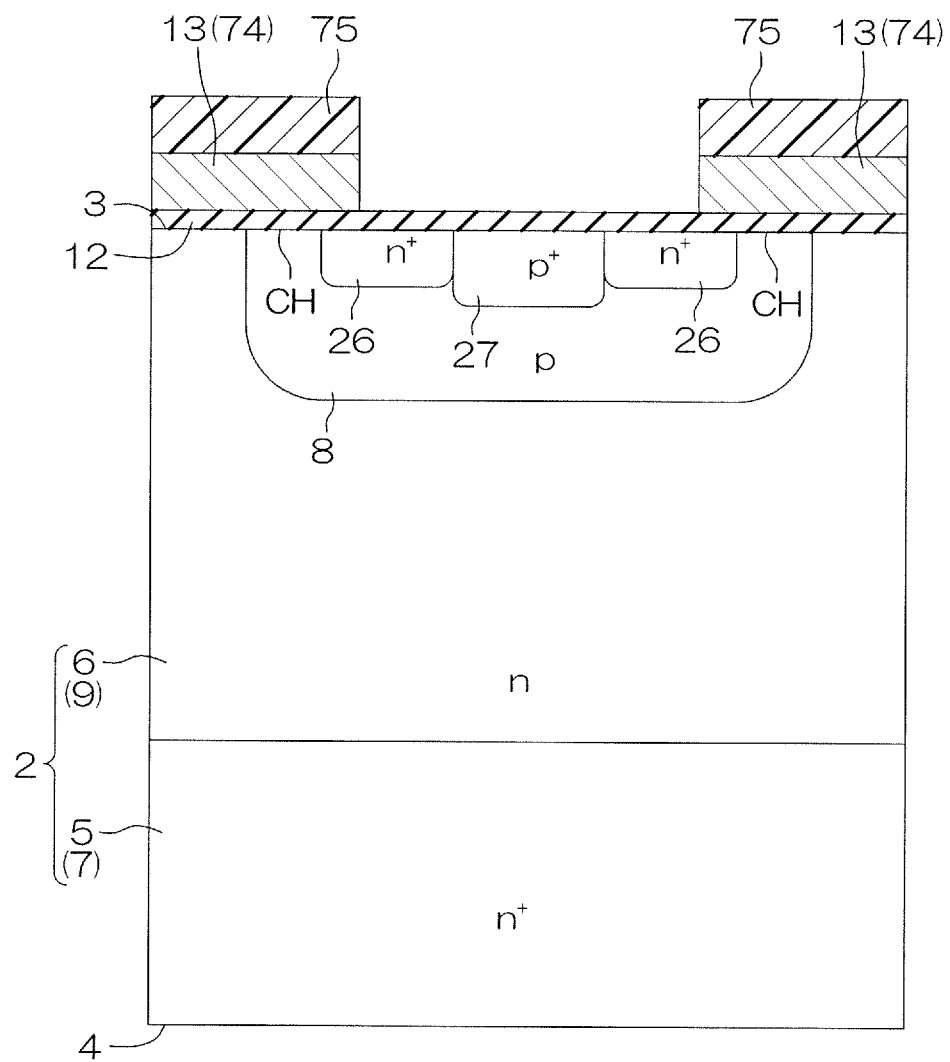
FIG. 10I is a cross-sectional view showing a step subsequent to that of FIG. 10H.

Thereafter, referring to FIG. 10I, a mask 75 that has a predetermined pattern is formed on the base electrode layer 74. The mask 75 coats a region in which the gate electrode layer 13 is to be formed in the base electrode layer 74.

Thereafter, a needless part of the base electrode layer 74 is removed. The needless part of the base electrode layer 74 may be removed according to an etching method (for example, wet etching method) in which the mask 75 is used. Hence, the gate electrode layer 13 is formed.

Figure 10J:
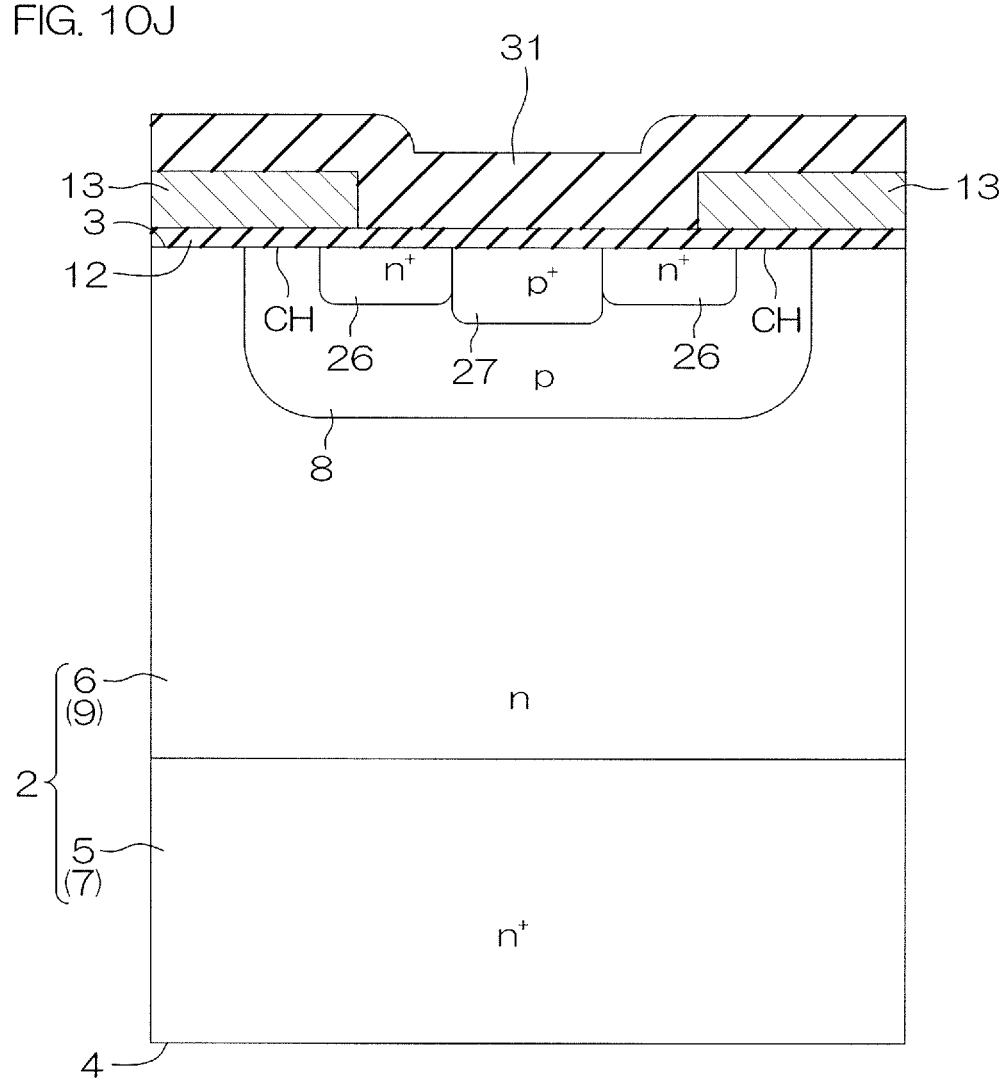
FIG. 10J is a cross-sectional view showing a step subsequent to that of FIG. 10I.

Thereafter, referring to FIG. 10J, the interlayer isolation layer 31 is formed on the first main surface 3 (step S17 of FIG. 9). The interlayer isolation layer 31 may include silicon oxide. The interlayer isolation layer 31 may be formed according to the CVD method.

Figure 10K:
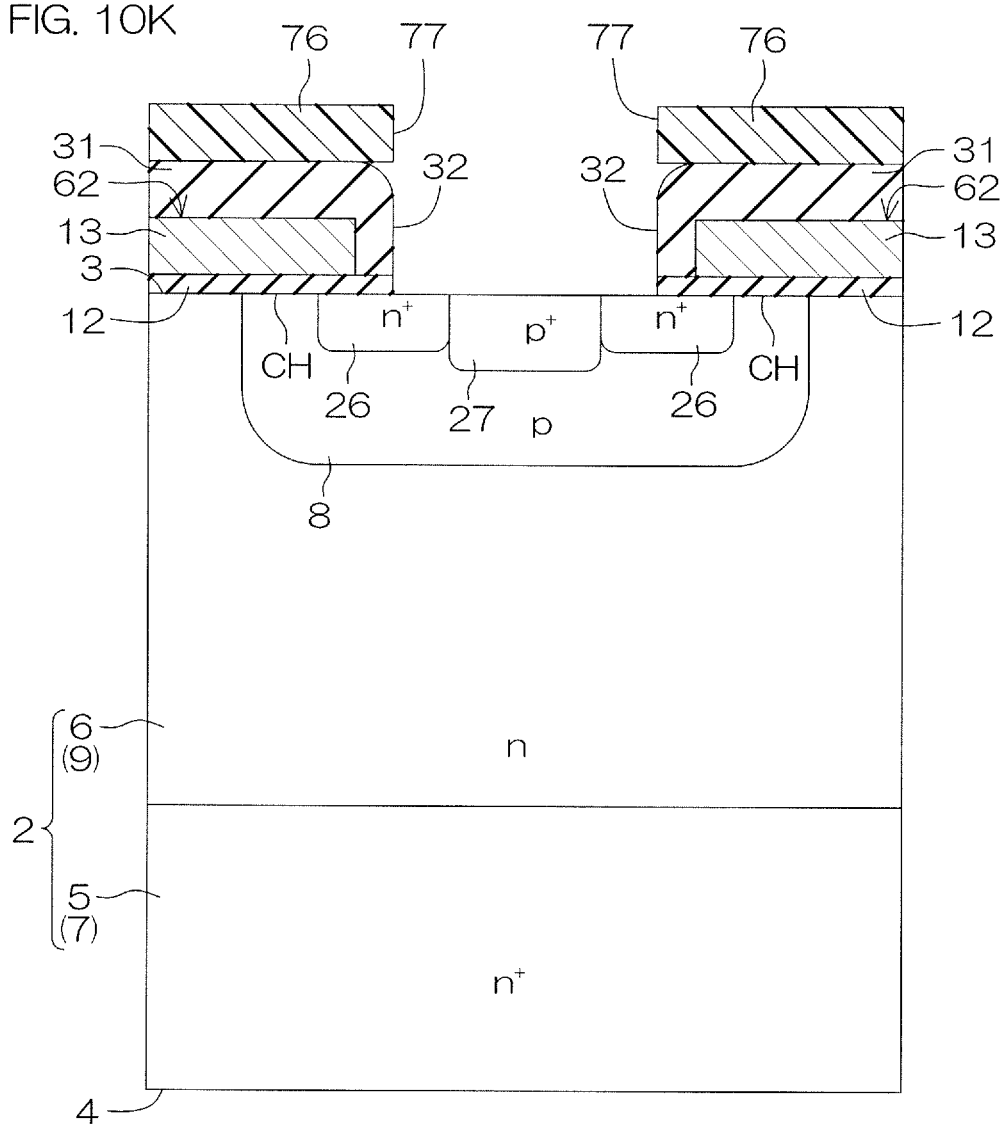
FIG. 10K is a cross-sectional view showing a step subsequent to that of FIG. 10J.

Thereafter, referring to FIG. 10K, a mask 76 that has a predetermined pattern is formed on the interlayer isolation layer 31 (step S18 of FIG. 9). The mask 76 may be a resist mask including a photosensitive resin. The mask 76 has an opening 77 by which a region in which the contact holes 32 are to be formed is exposed.

Thereafter, a needless part of the interlayer isolation layer 31 is removed. The needless part of the interlayer isolation layer 31 may be removed according to the etching method (for example, wet etching method) in which the mask 76 is used. Hence, the contact holes 32 are formed. After the contact holes 32 are formed, the mask 76 is removed.

Figure 10L:
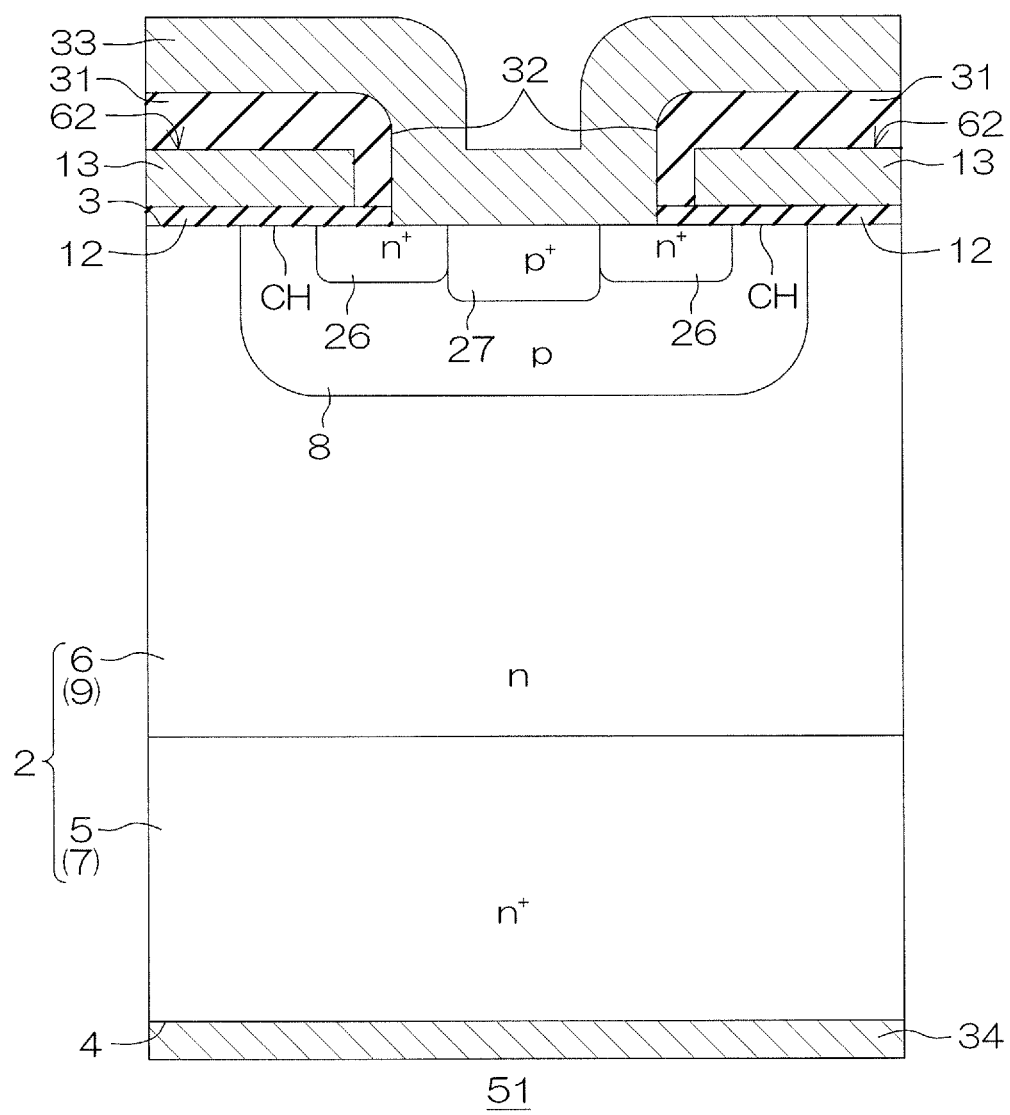
FIG. 10L is a cross-sectional view showing a step subsequent to that of FIG. 10K.

Thereafter, referring to FIG. 10L, the source electrode 33 is formed on the first main surface 3, and the drain electrode 34 is formed on the second main surface 4 (step S19 of FIG. 9). The semiconductor device 51 is manufactured through steps including the aforementioned steps.

As described above, the semiconductor device 51 according to the present preferred embodiment has the same structure as the semiconductor device 1 except that it has the planar gate structure 62 instead of the trench gate structure 10. Therefore, likewise, in the semiconductor device 51 and in the method for manufacturing the semiconductor device 51, it is possible to fulfill the same effects as those described in the semiconductor device 1 and in the method for manufacturing the semiconductor device 1.

Figure 11:
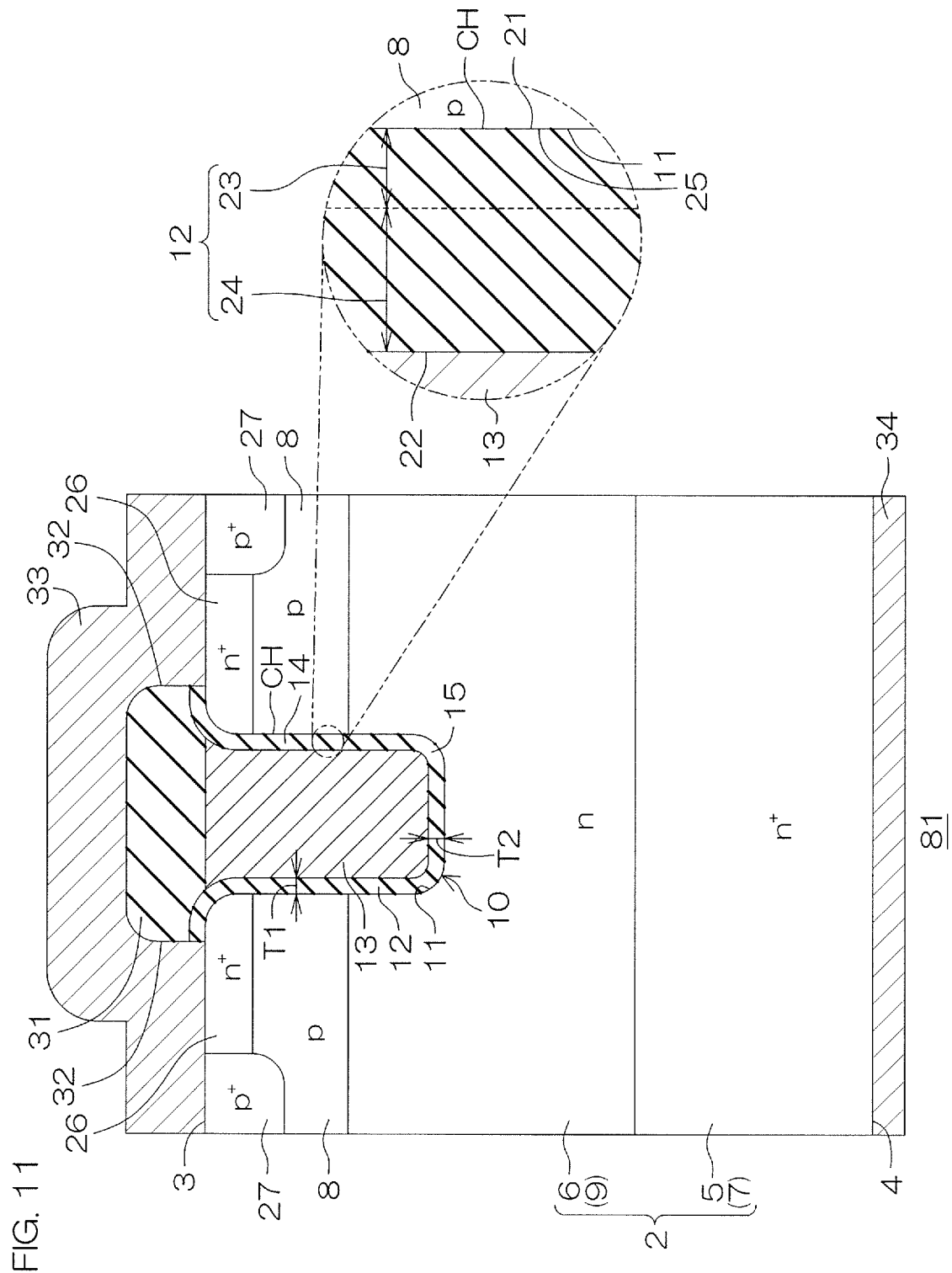
FIG. 11 is a cross-sectional view showing a region in which a trench-gate type MISFET is formed in a semiconductor device according to a third preferred embodiment of the present invention.

FIG. 11 is a cross-sectional view showing a region in which a trench-gate type MISFET is formed in a semiconductor device 81 according to a third preferred embodiment of the present invention. In the semiconductor device 1 according to the first preferred embodiment, a description has been given to the effect that the gate oxide layer 12 may be formed with a uniform thickness. Additionally, in the semiconductor device 1 according to the first preferred embodiment, a description has been given to the effect that the gate oxide layer 12 may be formed according to the CVD method in the step of FIG. 3G.

The semiconductor device 81 according to the third preferred embodiment is one mode example of the semiconductor device 1 including the gate oxide layer 12 formed according to the CVD method. In the following third preferred embodiment, the same reference sign is given to a component structure equivalent to each component structure of the semiconductor device 1, and a description of the component structure is omitted.

Referring to FIG. 11, the gate oxide layer 12 is formed according to the CVD method in the present preferred embodiment, and is formed in the shape of a film with which the side wall and the bottom wall of the gate trench 11 are coated with a uniform thickness. In other words, the first thickness T1 of the gate oxide layer 12 is substantially equal to the second thickness T2 of the gate oxide layer 12 (T1=T2 (T1≈T2)).

The fact that the first thickness T1 is substantially equal to the second thickness T2 denotes that the first thickness T1 has a value (T2×0.9≤T1≤T2×1.1) within ±10% of the second thickness T2. Of course, under the condition that the gate oxide layer 12 is formed according to the CVD method, the first thickness T1 may exceed the second thickness T2 (e.g., T1>T2×1.1) or may be less than the second thickness T2 (e.g., T1<T2×0.9).

As shown in FIG. 3A to FIG. 3N, the semiconductor device 81 is manufactured according to the same manufacturing method as the manufacturing method of the semiconductor device 1. Additionally, as shown in FIG. 4, the carbon density profile of the gate oxide layer 12 according to the semiconductor device 81 is the same as the carbon density profile of the third reference gate oxide layer (i.e., gate oxide layer 12).

As described above, likewise, in the semiconductor device 81 and in the method for manufacturing the semiconductor device 81, it is possible to fulfill the same effects as those described in the semiconductor device 1 and in the method for manufacturing the semiconductor device 1.

Although the preferred embodiments of the present invention have been described, the present invention can be embodied in other modes.

For example, the oxygen atom introducing step (step S6 of FIG. 2 and step S15 of FIG. 9) is performed after performing the nitrogen atom introducing step (step S5 of FIG. 2 and step S14 of FIG. 9) as described in each of the aforementioned preferred embodiments. However, only the oxygen atom introducing step (step S6 of FIG. 2 and step S15 of FIG. 9) may be performed without performing the nitrogen atom introducing step (step S5 of FIG. 2 and step S14 of FIG. 9) in each of the aforementioned preferred embodiments.

The nitrogen atom introducing step (step S5 of FIG. 2 and step S14 of FIG. 9) and the oxygen atom introducing step (step S6 of FIG. 2 and step S15 of FIG. 9) are applied to the gate oxide layer 12 as described in each of the aforementioned preferred embodiments. However, the nitrogen atom introducing step (step S5 of FIG. 2 and step S14 of FIG. 9) and the oxygen atom introducing step (step S6 of FIG. 2 and step S15 of FIG. 9) may be applied to the $SiO_2$ layer excluding the gate oxide layer 12.

The SiO$_2$ layer excluding the gate oxide layer 12 may include a SiO$_2$ layer for region separation typified by a LOCOS (Local Oxidation Of Silicon) layer. Besides, a SiO$_2$ layer formed by oxidizing the first main surface 3 or a SiO$_2$ layer formed at the first main surface 3 according to the CVD method is appropriate as the SiO$_2$ layer excluding the gate oxide layer 12.

The technical idea that the nitrogen atom introducing step (step S5 of FIG. 2 and step S14 of FIG. 9) and the oxygen atom introducing step (step S6 of FIG. 2 and step S15 of FIG. 9) are performed and that carbon atoms are detached from the gate oxide layer 12 (SiO$_2$ layer) and from the interfacial region 25 can also expect a certain effect in an insulating layer that includes inorganic insulators excluding SiO$_2$.

A SiN (silicon nitride) layer, an Al$_2$O$_3$ (aluminum oxide) layer, an ONO layer, etc., can be mentioned as the insulating layer that includes inorganic insulators excluding SiO$_2$. The an ONO layer has a layered structure including a SiO$_2$ layer, a SiN layer, and a SiO$_2$ layer that are stacked together in this order on the first main surface 3 of the SiC semiconductor layer 2. In other words, the gate oxide layer 12 may include a SiN layer, an Al$_2$O$_3$ layer, an ONO layer, etc., instead of or in addition to SiO$_2$ in each of the aforementioned preferred embodiments.

A structure in which the conductivity type of each semiconductor part is reversed may be employed in each of the aforementioned preferred embodiments. In other words, the p type part may be changed to the n type, whereas the n type part may be changed to the p type.

A p$^+$ type SiC semiconductor substrate 5 may be employed instead of the n$^+$ type SiC semiconductor substrate 5 in each of the aforementioned preferred embodiments. The p$^+$ type SiC semiconductor substrate 5 functions as a collector region of an IGBT (Insulated Gate Bipolar Transistor). In this case, the "source" of the MISFET is read as an "emitter" of the IGBT, and the "drain" of the MISFET is read as a "collector" of the IGBT in each of the aforementioned preferred embodiments.

In this description, no limitations are imposed on any combination form of features shown in the first to third preferred embodiments. The first to third preferred embodiments can be combined together in an arbitrary aspect and an arbitrary mode among them. In other words, a form in which features shown in the first to third preferred embodiments are combined together in an arbitrary aspect and an arbitrary mode may be employed.

This application corresponds to Japanese Patent Application No. 2018-005735 filed in the Japan Patent Office on Jan. 17, 2018, and the entire disclosure of the application is incorporated herein by reference.

Examples of the features extracted from the description and drawings are shown hereinafter.

[A1] A semiconductor device manufacturing method comprising: a step of preparing a SiC semiconductor layer; a step of forming a SiO$_2$ layer on the SiC semiconductor layer; and an oxygen atom introducing step of introducing oxygen atoms into the SiO$_2$ layer by applying annealing treatment in a low-oxygen partial pressure atmosphere.

[A2] The semiconductor device manufacturing method according to A1, further comprising a nitrogen atom introducing step of introducing nitrogen atoms into the SiO$_2$ layer by applying annealing treatment in an atmosphere including nitrogen atoms prior to the oxygen atom introducing step.

[A3] The semiconductor device manufacturing method according to A2, wherein the nitrogen atom introducing step includes a step of applying annealing treatment in an atmosphere including oxygen atoms and nitrogen atoms.

[A4] The semiconductor device manufacturing method according to any one of A1 to A3, wherein the SiO$_2$ layer that has a thickness of 20 nm or more is formed.

[A5] The semiconductor device manufacturing method according to any one of A1 to A4, wherein the SiO$_2$ layer is formed according to an oxidation treatment method.

[A6] The semiconductor device manufacturing method according to any one of A1 to A4, wherein the SiO$_2$ layer is formed according to a CVD (Chemical Vapor Deposition) method.

[A7] The semiconductor device manufacturing method according to any one of A1 to A6, wherein the step of preparing the SiC semiconductor layer includes a step of preparing a SiC semiconductor substrate and a step of forming a SiC epitaxial layer on the SiC semiconductor substrate according to an epitaxial growth method, and the SiO$_2$ layer is formed on the SiC epitaxial layer.

[A8] The semiconductor device manufacturing method according to A7, wherein the SiC epitaxial layer that has an n type impurity concentration of not less than $1.0 \times 10^{15}$ cm$^{-3}$ and not more than $1.0 \times 10^{17}$ cm$^{-3}$ is formed.

[A9] The semiconductor device manufacturing method according to any one of A1 to A8, wherein the SiC semiconductor layer includes a 4H-SiC monocrystal, and has a main surface having an off-angle of 10° or less with respect to a <11-20> direction from a [0001] plane of the 4H-SiC monocrystal.

[A10] The semiconductor device manufacturing method according to any one of A1 to A9, further comprising a step of forming an electrode facing the SiC semiconductor layer with the SiO$_2$ layer between the electrode and the SiC semiconductor layer.

Although the preferred embodiments of the present invention have been described in detail, these preferred embodiments are merely concrete examples used to clarify the technical contents of the present invention, and the present invention should not be understood by being limited to these concrete examples, and the scope of the present invention is limited solely by the appended claims.

REFERENCE SIGNS LIST

1: Semiconductor device
2: SiC semiconductor layer
5: SiC semiconductor substrate
6: SiC epitaxial layer
12: Gate oxide layer (SiO$_2$ layer)
13: Gate electrode layer
21: Connection surface of gate oxide layer
22: Non-connection surface of gate oxide layer
23: Carbon-density-decreasing region
24: Low carbon density region
25: Interfacial region
51: Semiconductor device
81: Semiconductor device

The invention claimed is:
1. A semiconductor device comprising:
an SiC semiconductor layer of a first conductivity type;

a plurality of body regions of a second conductivity type that are formed in a surface layer portion of the SiC semiconductor layer;
a plurality of source regions of the first conductivity type that are formed in surface layer portions of the body regions, respectively;
an $SiO_2$ layer that covers the SiC semiconductor layer such as to straddle the plurality of adjacent source regions, and that has a connection surface in contact with the SiC semiconductor layer and a non-connection surface positioned on an opposite side to the connection surface;
a gate electrode that is arranged on the non-connection surface of the $SiO_2$ layer such as to expose a part of the non-connection surface;
an interlayer insulating layer that covers an exposed portion of the non-connection surface of the $SiO_2$ layer and the gate electrode; and
an interfacial region that is formed in a region between the SiC semiconductor layer and the $SiO_2$ layer, and that has an interface state density that is $4.0\times10^{11}$ $eV^{-1}\cdot cm^{-2}$ or less in a range in which an energy level from a conduction band edge is not less than 0.2 eV and not more than 0.5 eV,
wherein the $SiO_2$ layer has:
a carbon-density-decreasing region that is formed in a region on the connection surface side and in which a carbon density gradually decreases from the connection surface to the non-connection surface; and
a low carbon density region that is formed in a region on the non-connection surface side with respect to the carbon-density-decreasing region and that has a carbon density lower than a carbon density of the carbon-density-decreasing region.

2. The semiconductor device according to claim 1, wherein
the SiC semiconductor layer has a carbon density of not less than $1.0\times10^{22}$ $cm^{-3}$ and not more than $1.0\times10^{24}$ $cm^{-3}$.

3. The semiconductor device according to claim 1, wherein
the low carbon density region has a thickness equal to or greater than a thickness of the carbon-density-decreasing region.

4. The semiconductor device according to claim 1, wherein
the carbon density of the carbon-density-decreasing region gradually decreases from a carbon density of the SiC semiconductor layer.

5. The semiconductor device according to claim 1, wherein
a nitrogen atom density in a region on the connection surface side of the $SiO_2$ layer is greater than a nitrogen atom density in a region on the non-connection surface side of the $SiO_2$ layer.

6. The semiconductor device according to claim 1, wherein
the $SiO_2$ layer has a breakdown electric field strength of 9.0 $MV\cdot cm^{-1}$ or more.

7. The semiconductor device according to claim 1, wherein
the $SiO_2$ layer has a thickness of 20 nm or more.

8. The semiconductor device according to claim 1, wherein
the SiC semiconductor layer includes an SiC semiconductor substrate and an SiC epitaxial layer formed on the SiC semiconductor substrate, and
the body regions are formed in a surface layer portion of the SiC epitaxial layer.

9. The semiconductor device according to claim 8, wherein
the SiC epitaxial layer has a first conductivity type impurity concentration lower than a first conductivity type impurity concentration of the SiC semiconductor substrate.

10. A semiconductor device comprising:
an SiC semiconductor layer of a first conductivity type;
a body region of a second conductivity type that is formed in a surface layer portion of the SiC semiconductor layer;
a source region of the first conductivity type that is formed in a surface layer portion of the body region;
a trench that is formed in the SiC semiconductor layer such as to penetrate the source region and the body region;
an $SiO_2$ layer that is formed from an inside of the trench to a surface of the SiC semiconductor, and that has a connection surface in contact with the SiC semiconductor layer and a non-connection surface positioned on an opposite side to the connection surface;
a gate electrode that is arranged in the trench via the $SiO_2$ layer;
an interlayer insulating layer that covers an exposed portion of the non-connection surface of the $SiO_2$ layer and the gate electrode; and
an interfacial region that is formed in a region between the SiC semiconductor layer and the $SiO_2$ layer, and that has an interface state density that is $4.0\times10^{11}$ $eV^{-1}\cdot cm^{-2}$ or less in a range in which an energy level from a conduction band edge is not less than 0.2 eV and not more than 0.5 eV,
wherein the $SiO_2$ layer has:
a carbon-density-decreasing region that is formed in a region on the connection surface side and in which a carbon density gradually decreases from the connection surface to the non-connection surface; and
a low carbon density region that is formed in a region on the non-connection surface side with respect to the carbon-density-decreasing region and that has a carbon density lower than a carbon density of the carbon-density-decreasing region.

11. The semiconductor device according to claim 10, wherein
the SiC semiconductor layer has a carbon density of not less than $1.0\times10^{22}$ $cm^{-3}$ and not more than $1.0\times10^{24}$ $cm^{-3}$.

12. The semiconductor device according to claim 10, wherein
the low carbon density region has a thickness equal to or greater than a thickness of the carbon-density-decreasing region.

13. The semiconductor device according to claim 10, wherein
the carbon density of the carbon-density-decreasing region gradually decreases from a carbon density of the SiC semiconductor layer.

14. The semiconductor device according to claim 10, wherein
a nitrogen atom density in a region on the connection surface side of the $SiO_2$ layer is greater than a nitrogen atom density in a region on the non-connection surface side of the $SiO_2$ layer.

15. The semiconductor device according to claim 10, wherein the SiO$_2$ layer has a breakdown electric field strength of 9.0 MV·cm$^{-1}$ or more.

16. The semiconductor device according to claim 10, wherein
the SiO$_2$ layer has a thickness of 20 nm or more.

17. The semiconductor device according to claim 10, wherein
the SiC semiconductor layer includes an SiC semiconductor substrate and an SiC epitaxial layer formed on the SiC semiconductor substrate,
the body region is formed in a surface layer portion of the SiC epitaxial layer, and
the trench is formed in the SiC epitaxial layer.

18. The semiconductor device according to claim 17, wherein
the SiC epitaxial layer has a first conductivity type impurity concentration lower than a first conductivity type impurity concentration of the SiC semiconductor substrate.

* * * * *